(12) United States Patent
Urakami et al.

(10) Patent No.: US 8,840,256 B2
(45) Date of Patent: Sep. 23, 2014

(54) FOREIGN SUBSTANCE REMOVAL UNIT AND OPTICAL APPARATUS INCLUDING FOREIGN SUBSTANCE REMOVAL UNIT

(75) Inventors: Toshifumi Urakami, Yokohama (JP); Kaishi Ohashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 225 days.

(21) Appl. No.: 13/356,927

(22) Filed: Jan. 24, 2012

(65) Prior Publication Data

US 2012/0188639 A1  Jul. 26, 2012

(30) Foreign Application Priority Data

Jan. 25, 2011 (JP) ................. 2011-013255

(51) Int. Cl.
*G02B 1/00* (2006.01)
*B06B 1/02* (2006.01)
*H04N 5/217* (2011.01)
*H04N 5/232* (2006.01)
*H01L 41/09* (2006.01)
*H04N 5/369* (2011.01)

(52) U.S. Cl.
CPC .......... *G02B 27/006* (2013.01); *B06B 2201/55* (2013.01); *B06B 1/0276* (2013.01); *H04N 5/2171* (2013.01); *H04N 5/23209* (2013.01); *H01L 41/0933* (2013.01); *H04N 5/3696* (2013.01)
USPC ...................................... 359/507

(58) Field of Classification Search
CPC ................................ G02B 27/0006
USPC .................. 359/507, 508; 310/311, 314
See application file for complete search history.

(56) References Cited

U.S. PATENT DOCUMENTS

| 2004/0012714 | A1 | 1/2004 | Kawai |
| 2007/0171295 | A1* | 7/2007 | Kawai ..................... 348/340 |
| 2008/0198458 | A1 | 8/2008 | Kashiyama |
| 2009/0207493 | A1 | 8/2009 | Ohashi |
| 2010/0246001 | A1 | 9/2010 | Urakami et al. |
| 2010/0315712 | A1 | 12/2010 | Kawai |

FOREIGN PATENT DOCUMENTS

| CN | 101344641 A | 1/2009 |
| JP | 2009-017461 A | 1/2009 |

\* cited by examiner

*Primary Examiner* — Euncha Cherry
(74) *Attorney, Agent, or Firm* — Canon USA Inc IP Division

(57) ABSTRACT

A foreign substance removal unit includes an optical member, disposed in an optical path, which is rectangular-shaped and in which an optical effective area for a light flux to pass through is set, and a piezoelectric element including a piezoelectric member, and a driving electrode, and a sensor electrode formed on a surface of the piezoelectric member. The piezoelectric element is stuck to a surface of the optical member outside the optical effective area and along one side of the optical member. The sensor electrode is formed on the surface of the piezoelectric member to be positioned within a range of the optical effective area in a side direction of the optical member to which the piezoelectric element is stuck.

18 Claims, 15 Drawing Sheets

FIG.4A

· WHEN m IS AN ODD NUMBER (m = 9)

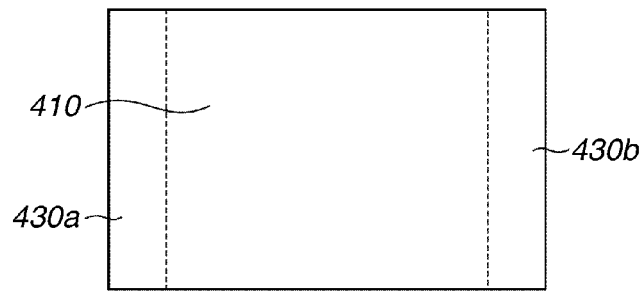

VIBRATION FORM OF
OPTICAL LOW-PASS FILTER 410 mTH-ORDER MODE 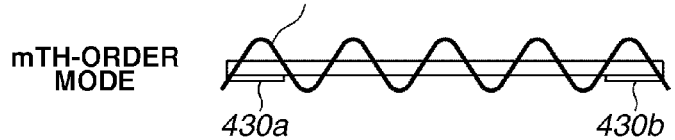

(m + 1)TH-ORDER MODE 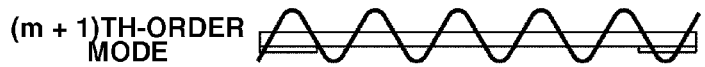

FIG.4B

| | | APPLIED VOLTAGE OF PIEZOELECTRIC ELEMENT 430a | | APPLIED VOLTAGE OF PIEZOELECTRIC ELEMENT 430b | |
|---|---|---|---|---|---|
| | | REAL COMPONENT | IMAGINARY COMPONENT | REAL COMPONENT | IMAGINARY COMPONENT |
| (1) | mTH-ORDER MODE | 1 | 0 | 1 | 0 |
| (2) | (m + 1)TH-ORDER MODE | A | 0 | -A | 0 |
| (3) | WHEN TIME PHASE OF (m + 1)TH-ORDER VIBRATION MODE IS SHIFTED BY 90° | 0 | A | 0 | -A |
| (4) | COMBINATION OF (1) AND (3) | 1 | A | 1 | -A |

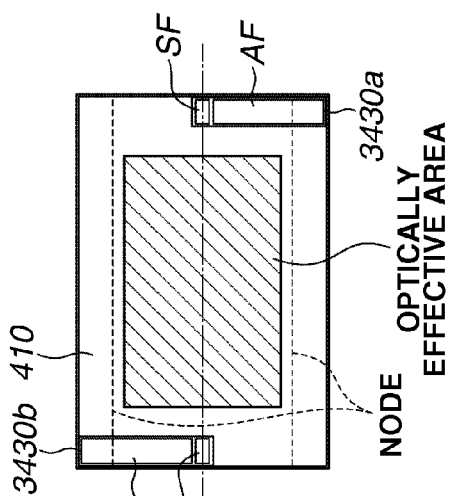
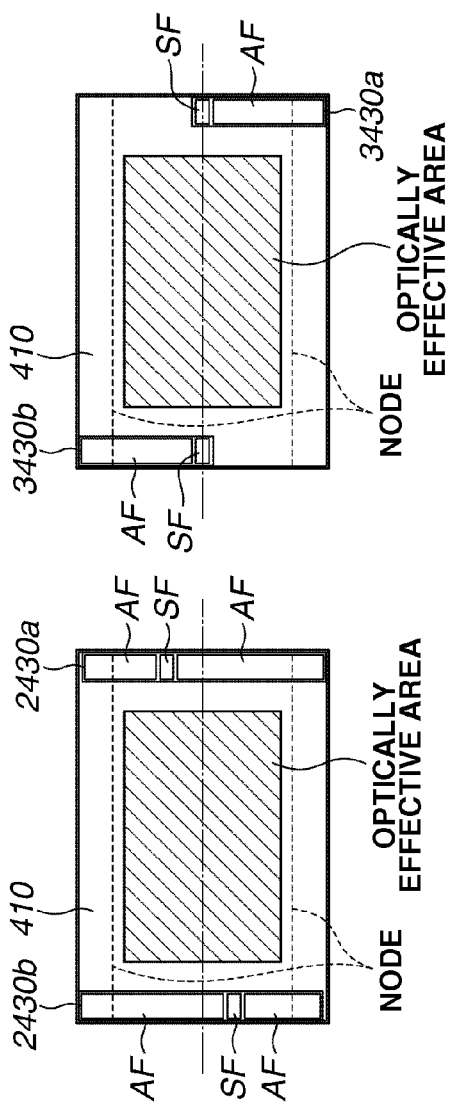
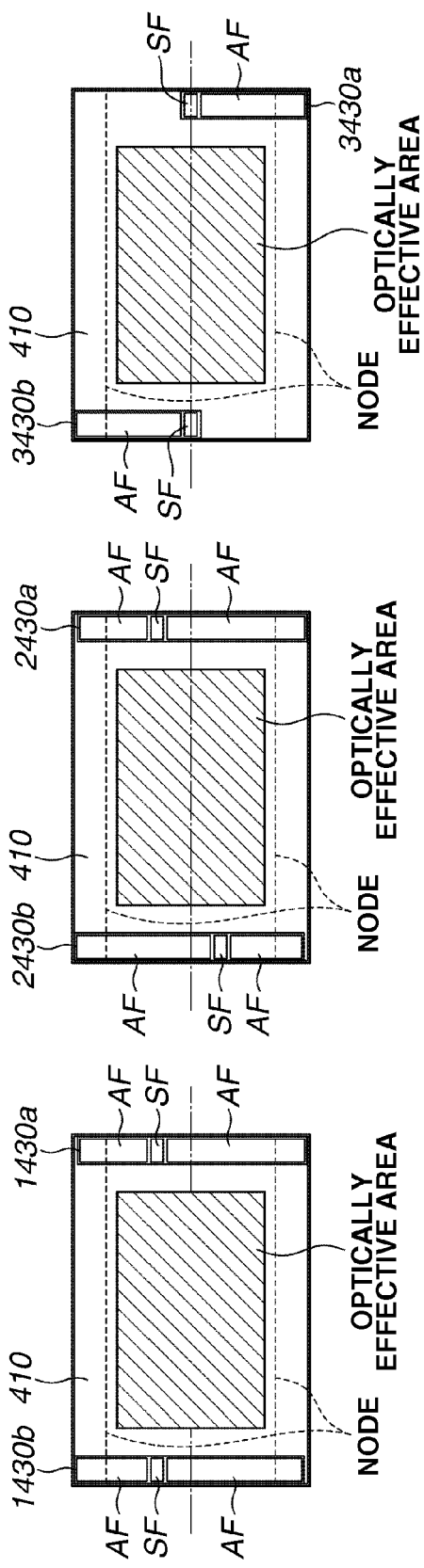
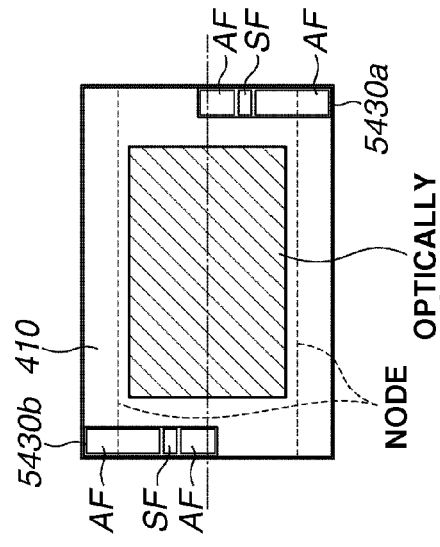
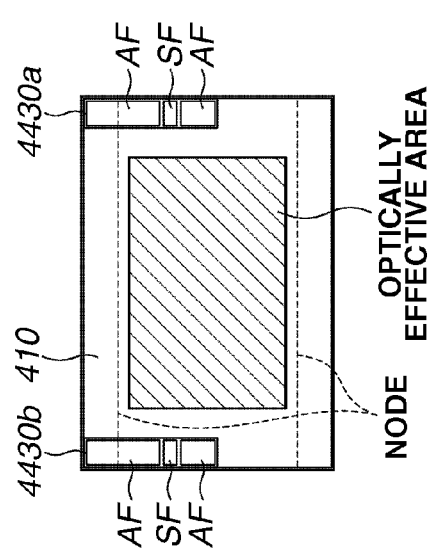

FIG.13A
· WHEN m IS AN ODD NUMBER (m = 9)
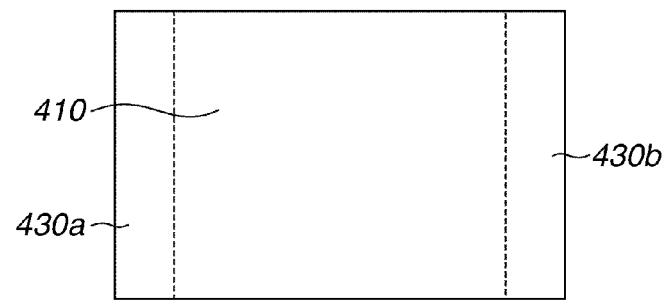
VIBRATION FORM OF
OPTICAL LOW-PASS FILTER 410
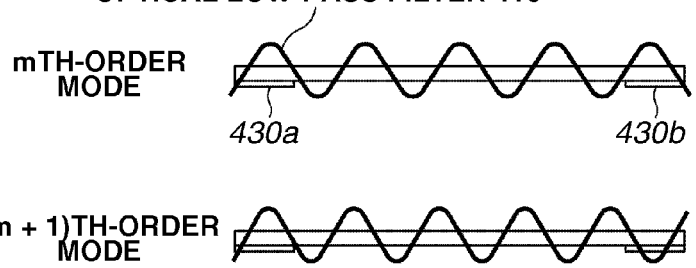
FIG.13B
| | | APPLIED VOLTAGE OF PIEZOELECTRIC ELEMENT 430a | | APPLIED VOLTAGE OF PIEZOELECTRIC ELEMENT 430b | |
|---|---|---|---|---|---|
| | | REAL COMPONENT | IMAGINARY COMPONENT | REAL COMPONENT | IMAGINARY COMPONENT |
| (1) | mTH-ORDER MODE | 1 | 0 | 1 | 0 |
| (2) | (m + 1)TH-ORDER MODE | A | 0 | -A | 0 |

FIG.15
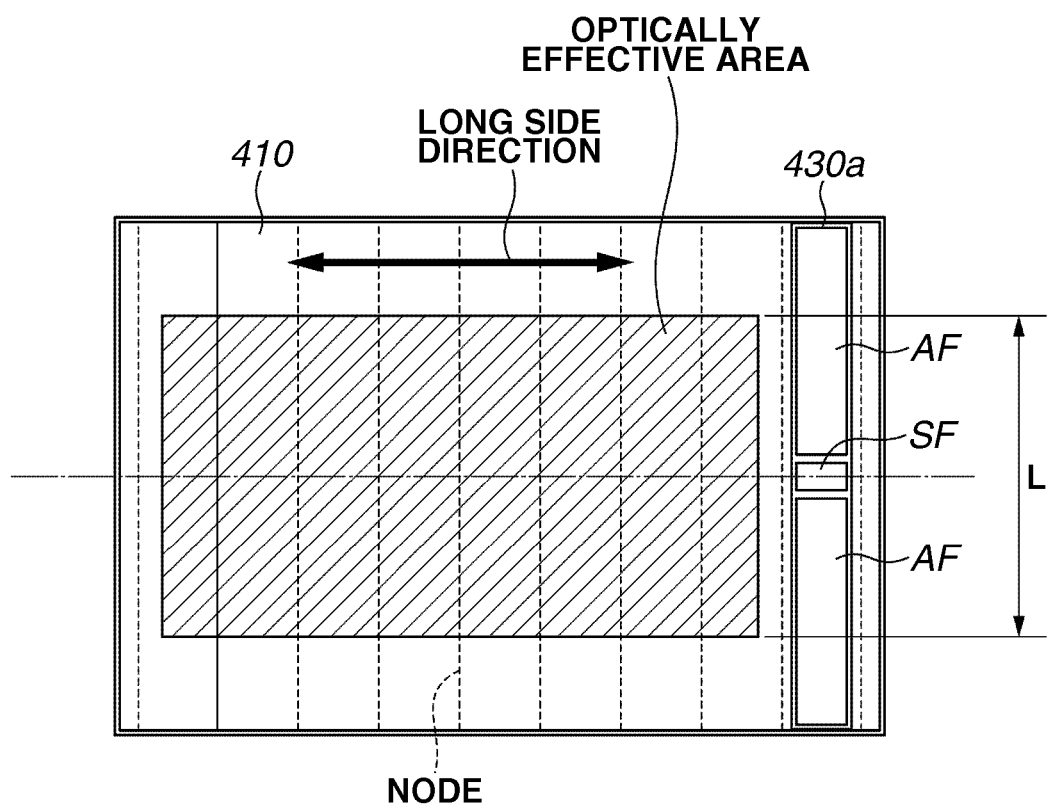
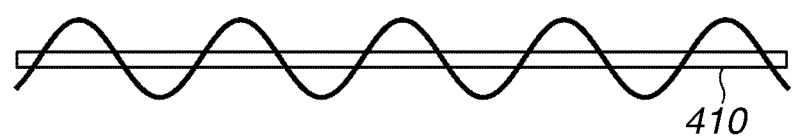

FOREIGN SUBSTANCE REMOVAL UNIT AND OPTICAL APPARATUS INCLUDING FOREIGN SUBSTANCE REMOVAL UNIT

BACKGROUND OF THE INVENTION

1. Field of the Invention

The present invention relates to a foreign substance removal unit eliminating foreign substance such as dust, and an optical apparatus including such a unit.

2. Description of the Related Art

In an optical apparatus, such as a digital camera, which performs imaging by converting an object image into an electrical signal, an image sensor receives an imaging light flux and outputs a photoelectric conversion signal. The optical apparatus then converts the output photoelectric conversion signal into image data. In such a case, an optical low-pass filter or an infrared absorption filter is disposed on the object side of the image sensor in the optical apparatus. If foreign substances such as dust adhere to a surface of such a filter, portions where the foreign substances are adhered may be included as black spots in a captured image, so that the visual quality of the image may be reduced.

In particular, in a digital single lens reflex camera with interchangeable lens, mechanical operating units such as a shutter and a quick-return mirror are disposed in the vicinity of the image sensor. Foreign substances, such as dust, may then be generated by the operating units, and may adhere to the surface of the image sensor or the filter. Further, when a user changes the lens, foreign substances may enter the main body of the camera, through an opening in the lens mount and may then become adhered to the surface of image sensor or the filter.

To avoid such phenomena, there is a known method for removing the foreign substances adhered to the surface of an optical filter disposed on the object side of the image sensor, by vibrating the optical filter using piezoelectric elements.

In such a method, it is desirable for the piezoelectric elements to cause the optical filter to vibrate at a resonance frequency so as to produce a large vibration amplitude and thus to efficiently remove the foreign substance. However, the resonance frequency of the optical filter is determined according to its external form, sheet thickness and physicality. The resonance frequency is thus different for each filter due to factors causing variation, such as processing accuracy and a manufacturing process.

Japanese Patent Application Laid-Open No. 2009-17461 addresses this problem through a technique in which a piezoelectric element is arranged in the vicinity of one side of a rectangular optical filter and is located parallel to the side of the optical filter. Further, a detection electrode is disposed on the front side of the piezoelectric element, and a detection ground electrode is disposed on the back side of the piezoelectric element, separately from a driving electrode. The resonance frequency is then searched for by monitoring electrode voltages, while the optical filter is vibrated using the piezoelectric element running through possible resonance frequencies. The dust adhered to the surface of the optical filter is thus removed.

When the optical filter is vibrated, the vibration is reflected at an edge of the optical filter, so that the reflected vibration and the main vibration interfere with each other. Such interference between the vibrations causes unevenness in the size of the vibration amplitude, or causes a vibration phase to be generated in the optical filter, which is different from the phase of the main vibration directly induced by the piezoelectric element. In particular, if the optical filter is rectangular-shaped instead of circular, the effect of the vibration interference further increases.

As a result, if the vibration detection electrodes are disposed at portions which are affected by the vibration interference, unevenness in the size and phase-shifting are generated in the electrode voltages. It thus becomes difficult for the vibration detection electrodes to correctly detect the main vibration. If the vibration detection electrodes falsely detect the main vibration, the piezoelectric element vibrates the optical filter out of the aimed resonance frequency and phase, so that the foreign substance adhered to the optical filter cannot be efficiently removed.

SUMMARY OF THE INVENTION

According to an aspect of the present invention, a foreign substance removal unit includes an optical member, disposed in an optical path, which is rectangular-shaped and in which an optical effective area for a light flux to pass through is set, and a piezoelectric element including a piezoelectric member, and a driving electrode and a sensor electrode formed on a surface of the piezoelectric member, wherein the piezoelectric element is stuck to a surface of the optical member outside the optical effective area and along one side of the optical member, and wherein the sensor electrode is formed on the surface of the piezoelectric member to be positioned within a range of an optical effective area in a side direction of the optical member to which the piezoelectric element is stuck.

According to the present invention, when the piezoelectric element causes the optical member to vibrate, the sensor electrode can correctly detect the vibration amplitude and phase without being affected by the vibration reflection at the edge of the optical member. The optical member can thus be more accurately vibrated at the desired vibration, and the efficiency of removing foreign substances such as dust adhered to the surface of the optical member can be improved.

Further features and aspects of the present invention will become apparent from the following detailed description of embodiments with reference to the attached drawings.

BRIEF DESCRIPTION OF THE DRAWINGS

The accompanying drawings, which are incorporated in and constitute a part of the specification, illustrate embodiments, features, and aspects of the invention and, together with the description, serve to explain the principles of the invention.

FIGS. 4A and 4B illustrate m-th order and (m+1)th order vibration mode waveforms, and the voltages applied to piezoelectric elements 430a and 430b according to the first embodiment.

FIG. 7 illustrates a configuration of the piezoelectric element 430a.

FIGS. 10A, 10B, 10C, 10D, and 10E illustrate modification examples of a position of a sensor electrode SF according to the first embodiment.

FIGS. 13A and 13B illustrate m-th order and (m+1)th order vibration mode waveforms, and the voltages applied to the piezoelectric elements 430a and 430b according to the second embodiment.

FIG. 15 illustrates a state in which the B sides of the piezoelectric elements 430a and 430b are stuck to the image sensor side surface of the optical low-pass filter 410, as viewed from the image sensor side, according to a third embodiment.

DESCRIPTION OF THE EMBODIMENTS

Various embodiments, features, and aspects of the invention will be described in detail below with reference to the drawings. Each of the embodiments of the present invention described below can be implemented solely or as a combination of a plurality of the embodiments or features thereof where necessary or where the combination of elements or features from individual embodiments in a single embodiment is beneficial.

A case where the present invention is applied to a digital camera, i.e., an example of the optical apparatus including a foreign substance removal unit, will be described below.

Figure 1:
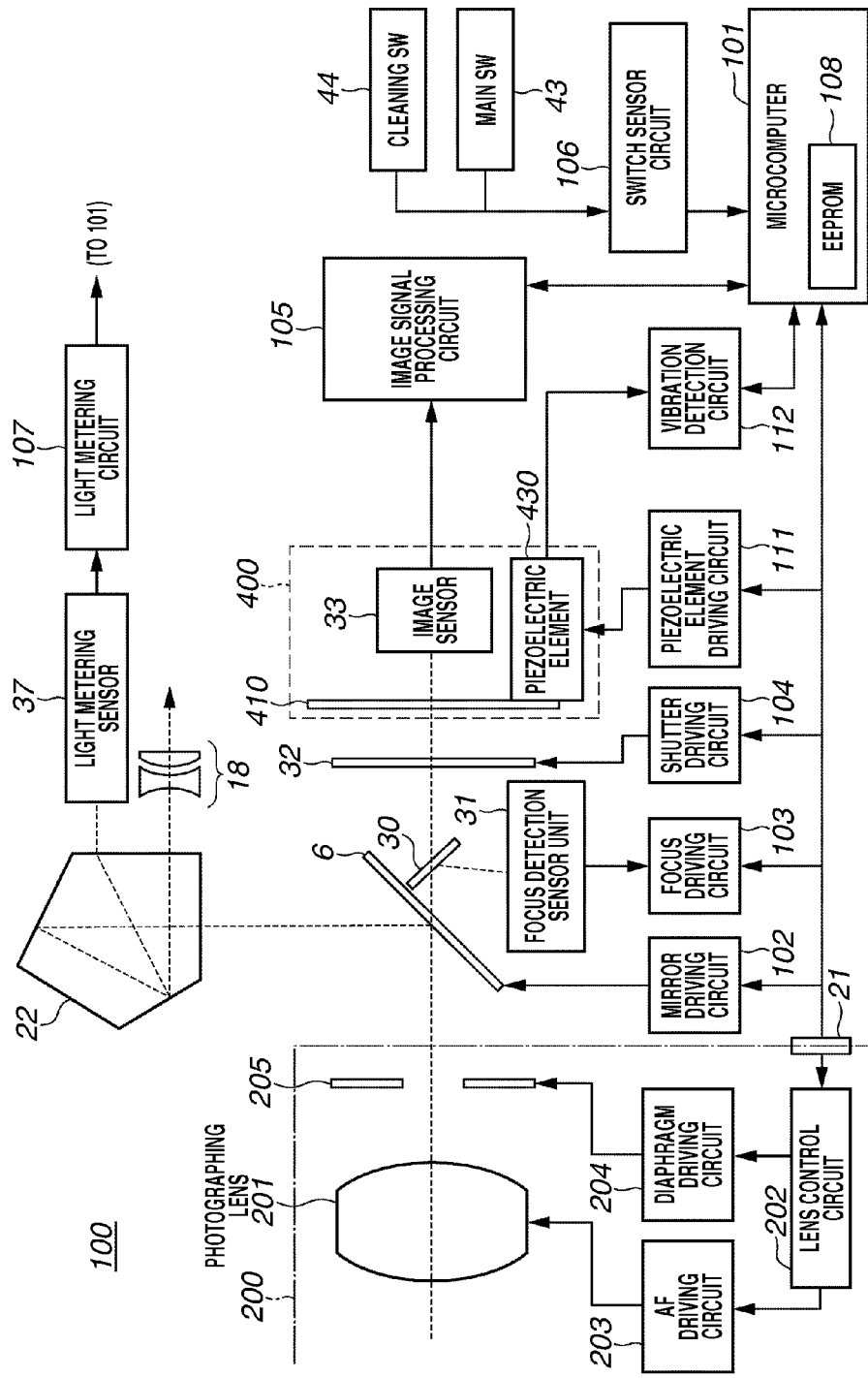
FIG. 1 is a block diagram illustrating a functional configuration of a digital camera 100 according to an embodiment of the present invention.

FIG. 1 is a block diagram illustrating a functional configuration of the digital camera 100 according to a first embodiment of the present invention.

Referring to FIG. 1, a microcomputer (MPU) 101, e.g., a central processing unit, controls each block included in the digital camera 100. The MPU 101 is connected to a mirror driving circuit 102, a focus driving circuit 103, a shutter driving circuit 104, an image signal processing circuit 105, a switch sensor circuit 106, a light metering circuit 107, a piezoelectric element driving circuit 111, and a vibration detection circuit 112. Such circuits operate according to control performed by the MPU 101.

The MPU 101 communicates with a lens control circuit 202 provided in an imaging lens unit 200 via a mount contact 21. When the imaging lens unit 200 is connected to the digital camera 100, the MPU 101 receives a signal via the mount contact 21 and determines that the MPU 101 has become communicatable with the lens control circuit 202 provided in the imaging lens unit 200.

Upon receiving a control signal form the MPU 101, the lens control circuit 202 drives via an auto-focus (AF) driving circuit 203 and a diaphragm driving circuit 204, a photographing lens 201 and a diaphragm 205 in the imaging lens unit 200. FIG. 1 illustrates only a single lens element of the photographing lens 201 for ease of description. However, the photographing lens 201 actually includes a plurality of lens groups such as a focus lens.

The AF driving circuit 203, which includes, for example, a stepping motor, changes a focus lens position in the photographing lens 201 according to control of the lens control circuit 202 to focus the imaging light flux on an image sensor 33. The diaphragm driving circuit 204 is a diaphragm mechanism such as an automatic iris, and changes a diaphragm amount of the diaphragm 205 according to control of the lens control circuit 202.

A main mirror 6 held at an angle of 45° with respect to an imaging optical axis illustrated in FIG. 1, guides the imaging light flux passing through the photographing lens 201 to a pentagonal prism 22. At the same time, the main mirror 6 transmits and guides to a sub-mirror 30 a portion of the imaging light flux. The sub-mirror 30 then guides the portion of the imaging light flux transmitted through the main mirror 6 to a focus detection sensor unit 31.

The mirror driving circuit 102 includes, for example, a direct current (DC) motor and a gear train. The mirror driving circuit 102 drives the main mirror 6 to a position at which the user can observe an object image through a finder, or to a position at which the main mirror 6 retracts from the imaging light flux. If the main mirror 6 is driven, the sub-mirror 30 is moved at the same time to a position at which the sub-mirror 30 guides the imaging light flux to the focus detection sensor unit 31 or to a position at which the sub-mirror 30 retracts from the imaging light flux.

The focus detection sensor unit 31 includes a field lens disposed in the vicinity of an imaging plane (not illustrated), a reflecting mirror, a secondary imaging lens, the diaphragm, and a line sensor including a plurality of charge-coupling devices (CCD). The focus detection sensor unit 31 performs a phase difference focus detection method. The signal output from the focus detection sensor unit 31 is supplied to the focus driving circuit 103, converted into the object image signal, and transmitted to the MPU 101.

The MPU 101 performs focus detection operation according to a phase difference detection method using the object image signal. More specifically, the MPU 101 calculates a defocus amount and a defocus direction using the object image signal. The MPU 101 then drives via the lens control circuit 202 and the AF driving circuit 203 the focus lens in the photographing lens 201 to an in-focus position, according to the calculated defocus amount and defocus direction.

The pentagonal prism 22 reflects and converts the imaging light flux reflected by the main mirror 6 into an erected non-reverse image. A photographer can thus observe the object image from a finder eyepiece window 18 via a finder optical system. Further, the pentagonal prism 22 guides a portion of the imaging light flux to a light metering sensor 37. The light metering circuit 107 receives a light metering value output from the light metering sensor 37, and converts the received output into a luminance signal corresponding to each area of the observation plane. The light metering circuit 37 then outputs the converted luminance signal to the MPU 100, and the MPU 100 calculates an exposure value based on the luminance signal.

A shutter unit 32 is a mechanical focal plane shutter. When the photographer observes the object image via the finder eyepiece window 18, a first shutter curtain is in a light-shielding position, and a second shutter curtain is in an exposure position.

Further, when the photographer is capturing an image, the first shutter curtain travels from the light-shielding position to the exposure position, i.e., performs exposure scanning. The imaging light flux then passes through the shutter unit 32, and the image sensor 33 performs photoelectrical conversion of the focused object image and thus performs imaging.

After a set shutter speed time has elapsed, the second shutter curtain travels from the exposure position to the light-shielding position, i.e., performs light-shielding scanning, so that imaging is completed with respect to one image data. The shutter unit 32 is controlled by the shutter driving circuit 104 that has received a control command from the MPU 101.

The image signal processing circuit 105 performs analog-digital (A/D) conversion with respect to an analog image signal output from the image sensor 33. The image signal processing circuit 105 then performs various types of image processing on the acquired digital image data, such as noise reduction and gain adjustment.

The switch sensor circuit 106 transmits to the MPU 101 an input signal which is input by the photographer operating on a user interface, such as a main switch (SW) 43 and a cleaning SW 44, included in the digital camera 100.

The cleaning SW 44 is the user interface used for instructing removal of the foreign substance, e.g., dust, adhered to the surface of the optical low-pass filter 410. The photographer operates the cleaning SW 44 and can manually perform removal of the foreign substance on the filter.

The imaging unit 400, i.e., the foreign substance removal unit, is a block in which components including the optical low-pass filter 410, the piezoelectric element 430, and the image sensor 33 are integrated as one unit. The image sensor 33 is an imaging device such as a complementary metal-oxide semiconductor (CMOS) sensor or the CCD sensor. The image sensor 33 outputs as described above the analog image signal by performing photoelectrical conversion on an optical image of the object.

The piezoelectric element 430 is, for example, a single-plate piezoelectric device which can be vibrated by the piezoelectric element driving circuit 111 that has received the control signal from the MPU 101. The vibration of the piezoelectric element 430 is then transmitted to the optical low-pass filter 410.

Figure 2:
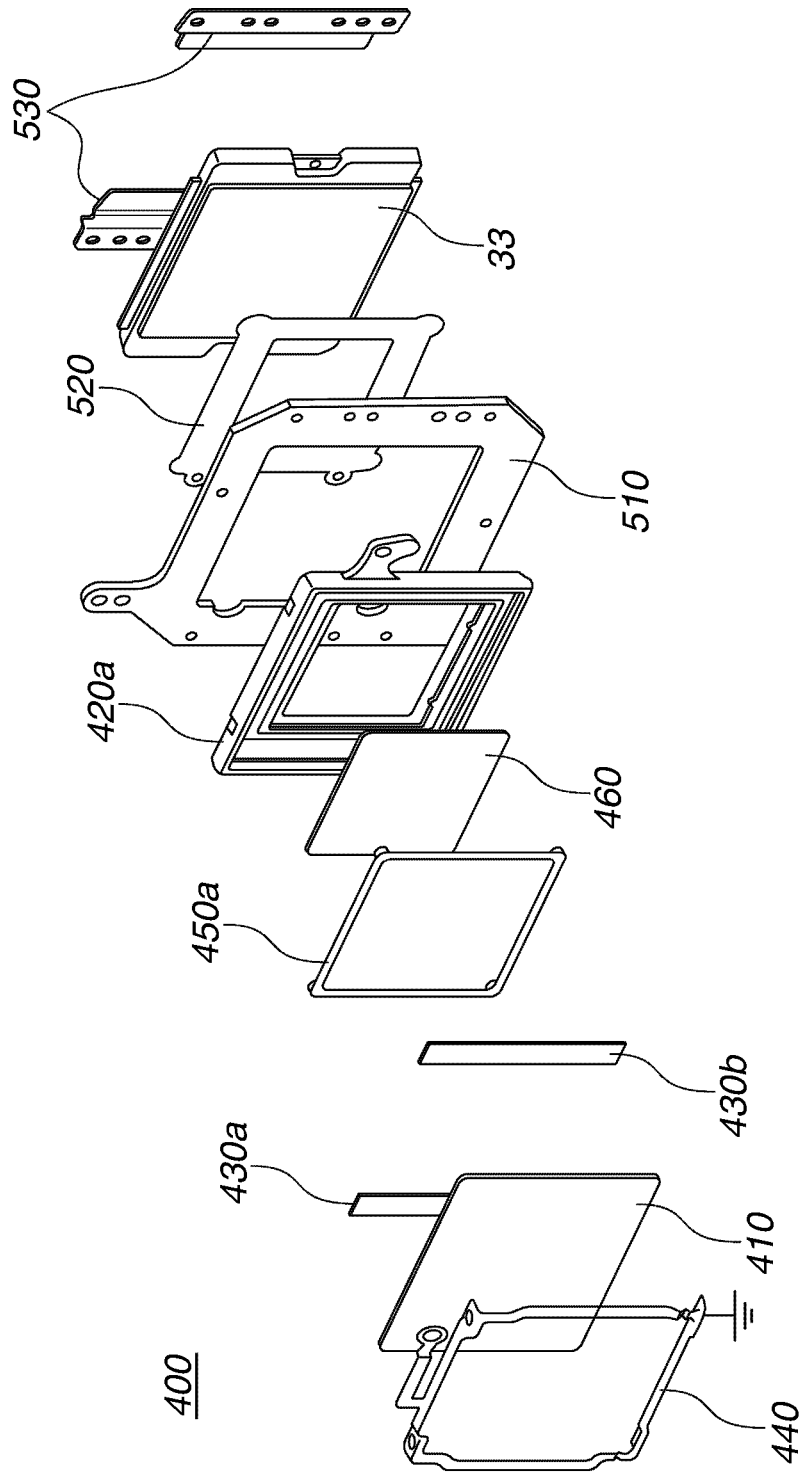
FIG. 2 is an exploded perspective view illustrating a configuration of an imaging unit 400.

The imaging unit 400, i.e., the foreign substance removal unit, which removes the foreign substance on the filter by vibrating the optical low-pass filter 410 will be described in detail below with reference to FIG. 2. FIG. 2 is an exploded perspective view illustrating the configuration of the imaging unit 400.

Referring to FIG. 2, the optical low-pass filter 410 disposed in front of the image sensor 33 is a single rectangular-shaped birefringent plate formed of quartz. The optical low-pass filter 410 disposed in the optical path is a rectangular-shaped optical member, and the optical effective area for the light flux to pass through is set therein.

The optical low-pass filter 410 includes peripheral edge portions outside the optical effective area, in which a pair of the piezoelectric elements 430a and 430b is disposed. The optical low-pass filter 410 is symmetrical in a direction perpendicular with respect to the center of the imaging optical axis (i.e., a horizontal direction of the camera). An optical coating, such as for realizing infrared cutting and antireflection, is applied to the surface of the optical low-pass filter 410.

The piezoelectric elements 430a and 430b which are rectangular strip-shaped, are each a single-plate piezoelectric member on which a plurality of electrodes is integrally formed. The piezoelectric elements 430a and 430b are disposed along two opposing short sides of the optical low-pass filter 410.

More specifically, the piezoelectric elements 430a and 430b are stuck to the peripheral edge portions of the optical low-pass filter 410, so that a long side of the piezoelectric element 430a, i.e., a first piezoelectric element, is parallel to one of the short sides (i.e., one side) of the optical low-pass filter 410. Further, the piezoelectric elements 430a and 430b are stuck to the peripheral edge portions of the optical low-pass filter 410, so that the long side of the piezoelectric element 430b, i.e., a second piezoelectric element, is parallel to the other short side (i.e., the other side) of the optical low-pass filter 410.

The optical low-pass filter 410 is vibrated in a wave form, and a plurality of anti-nodes and nodes parallel to the side thereof is thus generated. A voltage is periodically applied to the piezoelectric elements 430a and 430b, so that the piezoelectric element 430 performs expansion and contraction. A periodical flexion deformity is also generated in the optical low-pass filter 410 along with such expansion and contraction. The vibration will be described in detail below.

An optical low-pass filter holding member 420 formed of plastic or metal holds the optical low-pass filter 410. The optical low-pass filter holding member 420 is fixed to an image sensor holding member 510 with screws.

A biasing member 440 biases the optical low-pass filter 410 in a direction of the image sensor 33. The biasing member 440 is latched to the optical low-pass filter holding member 420. The biasing member 440 is electrically connected to a ground potential portion (i.e., a ground) of the digital camera 100.

The surface of the optical low-pass filter 410 is also electrically connected to the ground potential portion (i.e., the ground) of the digital camera 100. Electrostatic adhesion of foreign substances, e.g., dust, to the surface of the optical low-pass filter 410 can thus be reduced.

A frame-shaped elastic member 450 whose cross-section is proximately circular is sandwiched between the optical low-pass filter 410 and the optical low-pass filter holding member 420. When the biasing member 440 biases the optical low-pass filter 410, the elastic member 450 is closely-pressed between the optical low-pass filter 410 and the optical low-pass filter holding member 420. The amount of power by which the elastic member 450 is closely-pressed is thus determined by a biasing power of the biasing member 440 in the direction of the image sensor 33. The elastic member 450 may be formed of rubber or urethane foam such as poron.

An optical member 460 is formed by bonding together a phase plate (i.e., a depolarization plate), an infrared cut filter, and a birefringent plate whose refracting direction differs from that of the optical low-pass filter 410 by 90°. The optical member 460 is bonded and fixed to the optical low-pass filter holding member 420.

The image sensor holding member 510 has a rectangular opening. The image sensor 33 is securely fixed to the image sensor holding member 510 so that the image sensor 33 is exposed from the rectangular opening. The image sensor holding member 510 is fixed to the main body of the digital camera 100 with screws.

A mask 520 is held in a state sandwiched between the optical low-pass filter holding member 420 and the image sensor 33, to prevent excessive light from entering the image sensor 33 from outside the imaging optical path.

Image sensor biasing members 530 are plate-spring-formed biasing members with a pair of left and right portions.

The image sensor biasing members 530 are fixed to the image sensor holding member 510 with screws, and press the image sensor 33 against the image sensor holding member 510.

As a result of the above-described configuration, the optical low-pass filter 410 is supported to be vibratable, by being sandwiched between the biasing member 440 and the elastic member 450.

The vibration generated in the optical low-pass filter 410 according to the present embodiment will be described below with references to FIGS. 3, 4A, 4B, 5, and 6. According to the present embodiment, the traveling wave which travels in a long side direction (i.e., horizontal direction) of the optical low-pass filter 410 is generated in the optical low-pass filter 410. In other words, two bending vibrations whose orders differ by one are excited in the optical low-pass filter 410 by shifting a time phase, so that the traveling wave is generated in the optical low-pass filter 410.

Figure 3:
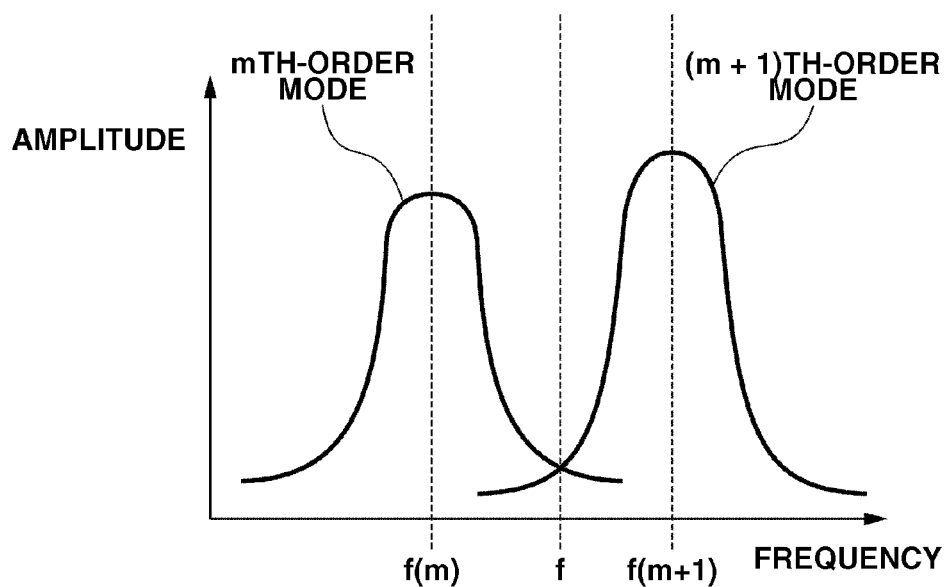
FIG. 3 is a graph illustrating a relationship between the frequency and the amplitude of two traveling waves excited in an optical low-pass filter 410 according to a first embodiment.

FIG. 3 is a graph illustrating the relationship between the frequency and the amplitude of two vibration modes excited in the optical low-pass filter 410 according to the present embodiment.

Referring to FIG. 3, the bending vibration in an mth-order vibration mode is excited at a frequency indicated as f(m), and the bending vibration in an (m+1)th-order vibration mode is excited at a frequency indicated as f(m+1). If the frequency f of the voltage to be applied to the piezoelectric elements 430a and 430b is then set so that f(m)<f<f(m+1), both the resonance generated in the bending vibration in the mth-order vibration mode and the resonance generated in the bending vibration in the (m+1)th-order vibration mode can be used.

If the frequency f is set so that f<f(m), the resonance generated in the bending vibration in the mth-order vibration mode can be used. However, since it becomes far from a resonance point in the bending vibration in the (m+1) th-order vibration mode, the resonance generated in the bending vibration in the (m+1) th-order vibration mode cannot be used.

Further, if the frequency f is set so that f(m+1)<f, only the resonance generated in the (m+1)th vibration mode can be used. Since the resonance generated in both vibration modes are used according to the present embodiment, the frequency f is set within the range in which f(m)<f<f(m+1).

FIGS. 4A and 4B illustrate waveforms generated in the mth-order and (m+1)th-order vibration modes when m is an odd number and the voltages to be applied to the piezoelectric elements 430a and 430b.

Referring to FIGS. 4A and 4B, a case where m=9 is illustrated as an example of m as an odd number. FIG. 4A illustrates the optical low-pass filter 410 as viewed from the main mirror 6 side. The piezoelectric elements 430a and 430b are stuck to the surface of the optical low-pass filter 410 facing the image sensor 33.

Referring to FIG. 4A, a plurality of nodes in the long side direction of the piezoelectric element 430 appear at equal intervals in the direction of the long side of the optical low-pass filter 410 in the bending vibration of each vibration mode.

FIG. 4B illustrates the amplitude and the time phase of the alternating voltage applied to the piezoelectric elements 430a and 430b for exciting the bending vibration in each vibration mode, expressed in terms of real and imaginary components. Referring to FIG. 4B, row (1) indicates the alternating voltage applied for exciting the bending vibration in the mth-order vibration mode, and row (2) indicates the alternating voltage applied for exciting the bending vibration in the (m+1)th-order vibration mode.

Row (3) indicates the alternating voltage applied when the time phase of the bending vibration in the (m+1)th-order vibration mode is shifted by 90°. The voltage applied for exciting the bending vibration in each vibration mode is normalized by the amplitude of the bending vibration in the mth-order vibration mode when an amplitude ratio between the bending vibrations in the mth-order vibration mode and in the (m+1)th-order vibration mode is A:1. As a result, the same amplitude is acquired for the bending vibrations in the two vibration modes.

If the bending vibrations in the mth-order vibration mode and the (m+1)th-order vibration mode are to be excited in the optical low-pass filter 410 at the same time, the alternating voltages indicated in rows (1) and (3) illustrated in FIG. 4B are added. In other words, the alternating voltage indicated in row (4) is applied to the piezoelectric elements 430a and 430b. According to the present embodiment, the bending vibration in the mth-order vibration mode corresponds to a first bending vibration. Further, the bending vibration in the (m+1)th-order vibration mode corresponds to a second bending vibration whose time phase is different from the first bending vibration by 90°.

The behavior of the optical low-pass filter 410 in the case where the bending vibrations in the two vibration modes are excited at the same time according to the above-described control method will be described below. According to the present embodiment, a ninth-order vibration mode and a tenth-order vibration mode are excited at the same time.

Figure 5:
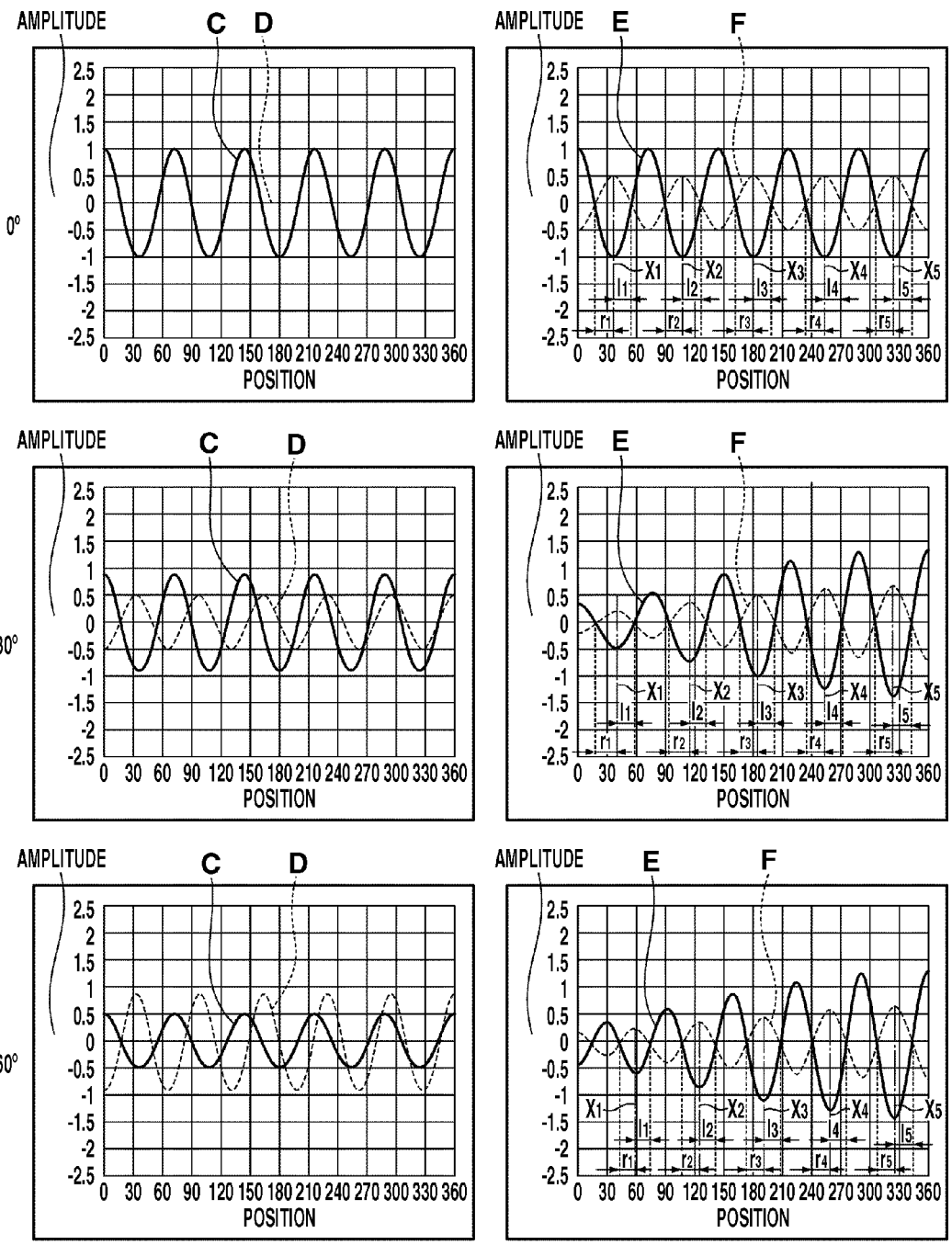
FIG. 5 illustrates the behavior of the optical low-pass filter 410 when the traveling waves of two vibration modes are excited at the same time.
Figure 6:
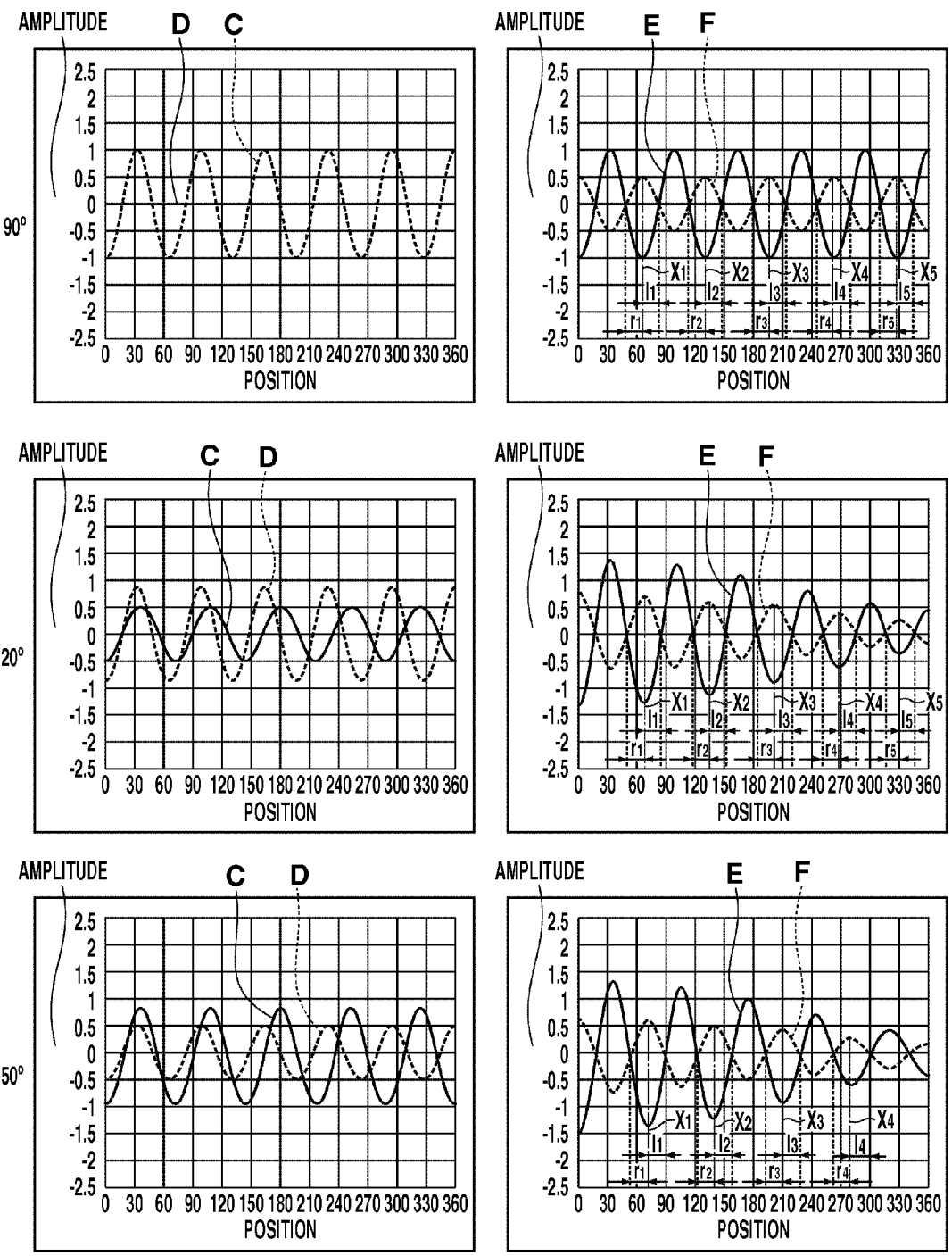
FIG. 6 illustrates the behavior of the optical low-pass filter 410 when the traveling waves of two vibration modes are excited at the same time.

FIGS. 5 and 6 illustrate the behavior of the optical low-pass filter 410 in each time phase in the case where the bending vibrations in two vibration modes are excited at the same time by shifting the time phase by 90°. Referring to FIGS. 5 and 6, a position in the optical low-pass filter 410 is indicated on a horizontal axis in terms of numbers 0 to 360 from the left to the right. Further, the long side direction of the optical low-pass filter 410 is indicated as X, the short side direction as Y, and a normal direction of the plane as Z.

Referring to FIGS. 5 and 6, waveform C indicates the waveform of the bending vibration in the ninth-order vibration mode, and waveform D illustrates the waveform of the bending vibration in the tenth-order vibration mode. Further, waveform E illustrates the waveform in which the above-described two modes are combined. In other words, the waveform E illustrates the actual amplitude of the optical low-pass filter 410. Waveform F illustrates an acceleration of the optical low-pass filter 410 in the Z direction.

The foreign substance adhered to the surface of the optical low-pass filter 410 receive a force in the normal direction and is caused to move by deforming the optical low-pass filter 410. More specifically, if a curve indicating the acceleration in the Z direction is of a positive value, the foreign substance is thrust outside the surface, and receives the force in the normal direction of the curve E indicating a displacement in the optical low-pass filter 410 at such time phase.

The foreign substance receives a force in the right direction (i.e., in a positive direction with respect to the X direction) in a section indicated as rn (n=1, 2, 3, . . . ) illustrated in FIGS. 5 and 6. In contrast, the foreign substance receives a force in the left direction (i.e., in a negative direction with respect to the X direction) in a section indicated as ln (n=1, 2, 3, . . . ). As a result, the foreign substance moves to a position indicated by Xn (n=1, 2, 3, . . . ). According to the present embodiment, Xn (n=1, 2, 3, . . . ) moves in the positive direction with respect to the X direction as the time phase progresses, so that the foreign substance moves in the positive direction with respect to the X direction.

Figure 7:
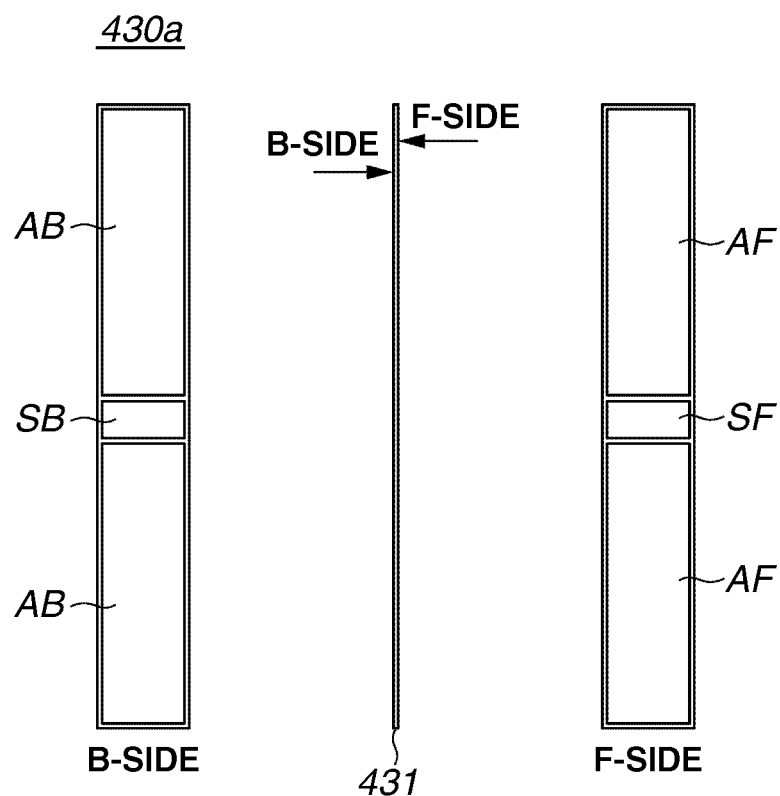

FIG. 7 illustrates a configuration of the piezoelectric element 430a, or a three-sided view of the piezoelectric element 430a. Referring to FIG. 7, the piezoelectric element 430a includes a piezoelectric member 431, i.e., a single-plate piezoelectric element, and four types of electrodes formed on the surface of the piezoelectric member 431. More specifically, driving electrodes AF and AB, a sensor electrode SF, and a ground electrode SB are formed on the surface of the piezoelectric member 431.

As illustrated in FIG. 7, two driving electrodes AF and one sensor electrode SF are formed on an F side (i.e., a first surface) of the piezoelectric member 431. In other words, a plurality of driving electrodes is formed on the F side (i.e., the first surface) of the piezoelectric member. Two driving electrodes AB and one ground electrode SB are formed on a B side (i.e., a second surface) of the piezoelectric member 431.

The two driving electrodes AF and the two driving electrodes AB are formed on opposite sides of each other, sandwiching the piezoelectric member 431 therebetween. The two driving electrodes AF and the two driving electrodes AB are driving electrodes for exciting the vibration in the optical low-pass filter 410.

The piezoelectric element driving circuit 111, i.e., the control circuit, alternately applies the voltage to the two driving electrodes AF and the two driving electrodes AB. The optical low-pass filter 410 is thus vibrated.

The sensor electrode SF is a vibration detection electrode which detects the vibration of the optical low-pass filter 410. The sensor electrode SF is formed between the driving electrodes AF on the F side (i.e., first surface) of the piezoelectric member 431.

The ground electrode SB is electrically connected to the ground potential portion (i.e., ground) of the digital camera 100. The ground electrode SB is formed between the driving electrodes AB on the B side (i.e., second surface) of the piezoelectric member 431. The sensor electrode SF and the ground electrode SB are formed on the opposite sides of each other, sandwiching the piezoelectric member 431 therebetween.

The sensor electrode SF monitors how the output voltage generated by the sensor electrode SF changes with respect to the ground electrode SB corresponding to the ground voltage, and detects the vibration of the optical low-pass filter 410.

The driving electrodes AF and AB, the sensor electrode SF, and the ground electrode SB are connected to a piezoelectric element flexible printed-circuit board (not illustrated) by thermal compression bonding, using anisotropically-conductive film (ACF). The driving electrodes AF and AB are connected to the piezoelectric element driving circuit 111 via a wiring pattern on the piezoelectric element flexible printed-circuit board.

The sensor electrode SF, i.e., the vibration detection electrode, is connected to the vibration detection circuit 112 via the wiring pattern on the piezoelectric element flexible printed-circuit board. The ground electrode SB is connected to the ground potential portion in the digital camera 100 via the wiring pattern on the piezoelectric element flexible printed-circuit board.

The F side or the B side of the piezoelectric member 431 in the piezoelectric element 430*a* configured as described above is thus stuck to the optical low-pass filter 410 so that the long side of the piezoelectric element 430*a* is parallel to one of the short sides (i.e., one side) of the optical low-pass filter 410.

The piezoelectric element 430*b* is configured similarly as the piezoelectric element 430*a*. The F side or the B side of the piezoelectric member 431 is stuck to the optical low-pass filter 410 so that the long side of the piezoelectric element 430*b* is parallel to the other short side (i.e., the other side) of the optical low-pass filter 410.

The position of the sensor electrode SF formed on each of the piezoelectric elements 430*a* and 430*b* when the piezoelectric elements 430*a* and 430*b* are stuck to the optical low-pass filter 410 will be described below.

Figure 8:
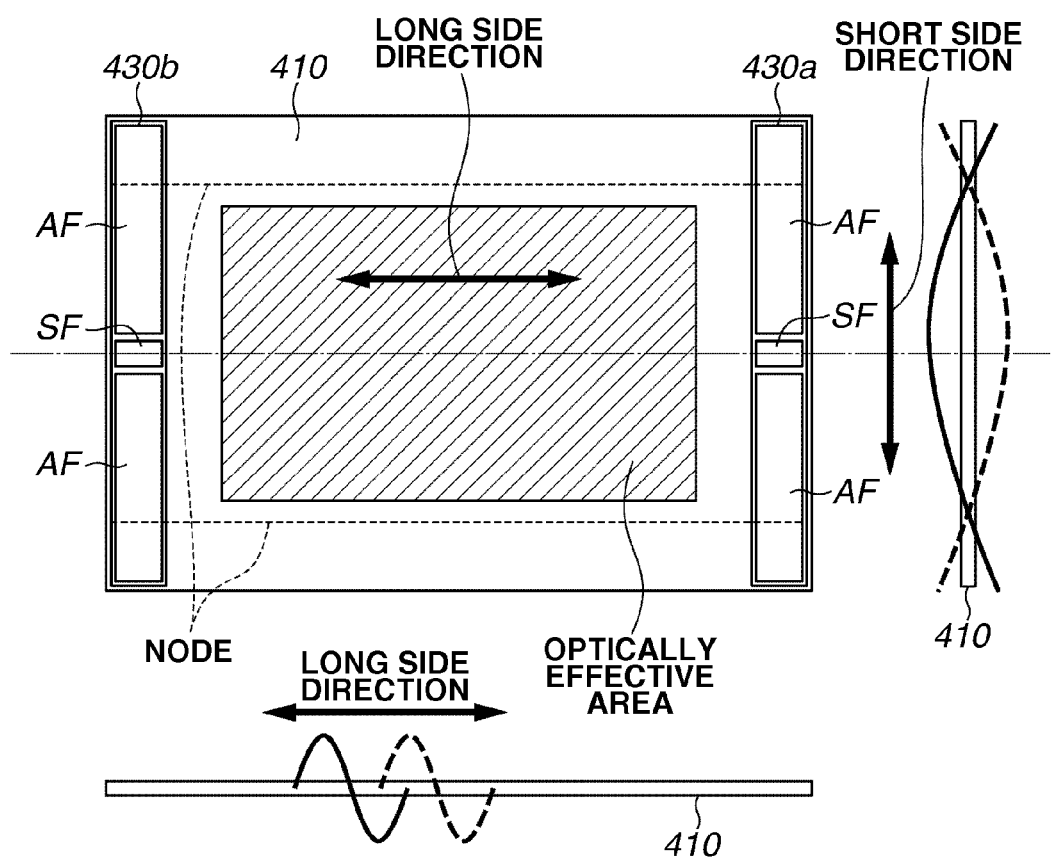
FIG. 8 illustrates a state in which B sides of the piezoelectric elements 430a and 430b are stuck to an image sensor side surface of the optical low-pass filter 410, as viewed from the image sensor side.

FIG. 8 illustrates the state in which the B sides of the piezoelectric elements 430*a* and 430*b* are stuck to the image sensor side surface of the optical low-pass filter 410, as viewed from the image sensor side.

Referring to FIG. 8, the piezoelectric element 430*a* is stuck to the optical low-pass filter 410 so that the long side thereof is disposed along one of the short sides (i.e., one side) of the optical low-pass filter 410. A length of the long side of the piezoelectric element 430*a* is approximately equal to the length of one of the short sides (i.e., one side) of the optical low-pass filter 410.

Further, as illustrated in FIG. 8, the piezoelectric element 430*b* is stuck to the optical low-pass filter 410 so that the long side thereof is disposed along the other short side (i.e., the other side) of the optical low-pass filter 410. A length of the long side of the piezoelectric element 430*b* is approximately equal to the length of the other short side (i.e., other side) of the optical low-pass filter 410.

As described above, the optical low-pass filter 410 is vibrated at frequency f (i.e., f(m)<f<f(m+1)) to convey the foreign substance. In such a case, it is necessary for the frequency f to be between frequencies f(m) and f(m+1) at which the traveling wave that is most appropriate for conveying the foreign substance is excited.

FIG. 8 illustrates a schematic diagram of the traveling wave at frequency f. FIG. 8 illustrates only the optical low-pass filter 410, and the piezoelectric elements 430*a* and 430*b* as viewed from the image sensor side. Further, a shaded area indicates the optical effective area through which the incident imaging light flux of the digital camera 100 passes.

As illustrated in FIG. 8, the traveling wave which travels in the direction of the long side of the optical low-pass filter 410 is excited. In other words, the excited traveling wave travels in the direction perpendicular to the short side of the optical low-pass filter 410 to which the piezoelectric elements 430*a* and 430*b* are stuck. In such a case, the stationary wave in a first-order vibration mode is generated in the short side of the optical low-pass filter 410, as illustrated in FIG. 8.

Dotted lines illustrated in FIG. 8 indicate the nodes of the first-order stationary wave. Each of the nodes of the first-order stationary wave appears in the short side direction of the optical low-pass filter 410, to be symmetrical with respect to the central axis in the short side direction of the optical low-pass filter 410. The first-order stationary wave is generated at a frequency between the frequency f(m) (i.e., frequency of the mth-order vibration mode) and the frequency f(m+1) (i.e., frequency of the n+1th-order vibration mode).

The foreign substance adhered on the surface of the optical low-pass filter 410 is thus conveyed in the long side direction of the optical low-pass filter 410 by a combined wave. The combined wave is formed of the traveling wave which travels in the long side direction of the optical low-pass filter 410, and the first-order stationary wave generated in the short side direction of the optical low-pass filter 410.

The amplitude of the combined wave that conveys the foreign substance becomes largest at the central axis in the short side direction of the optical low-pass filter 410, corresponding to the anti-node of the first-order stationary wave generated in the short side direction of the optical low-pass filter 410.

The amplitude of the combined wave that conveys the foreign substance gradually decreases, from the central axis in the short side direction of the optical low-pass filter 410 to the portion corresponding to the node of the first-order stationary wave generated in the short side direction of the optical low-pass filter 410. The amplitude becomes smallest at the portion corresponding to the node of the first-order stationary wave generated in the short side direction of the optical low-pass filter 410.

As a result, the amplitude necessary for conveying the foreign substance may not be acquired at the portion corresponding to the node of the first-order stationary wave generated in the short side direction of the optical low-pass filter 410.

According to the present embodiment, the size of the optical low-pass filter is optimized so that the above-described node of the first-order stationary wave is generated outside the optical effective area. In other words, the size of the optical low-pass filter is designed so that the node of the first-order stationary wave is generated outside the optical effective area. Sufficient amplitude necessary for conveying the foreign substance can thus be acquired within the optical effective area.

The traveling wave which travels in the long side direction of the optical low-pass filter 410 is reflected at long side edges of the optical low-pass filter 410, i.e., at the edges of the optical low-pass filter 410 to which the piezoelectric elements 430a and 430b are not stuck. As a result, a vibration different from the first-order stationary wave generated in the short side direction of the optical low-pass filter 410 is generated.

A reflection wave generated at the long side edges of the optical low-pass filter 410 interferes with the combined wave that conveys the foreign substance. Such interference generates unevenness in the size of the amplitude of the combined wave in the vicinity of the long side edges of the optical low-pass filter 410, and a vibration whose phase is different from the phase of the combined wave that conveys the foreign substance.

As a result, if the sensor electrode SF is located on the outside with respect to the node of the first-order stationary wave generated in the short side direction of the optical low-pass filter 410, the sensor electrode SF cannot accurately detect the combined wave that conveys the foreign substance.

On the other hand, if the sensor electrode SF is located on the node of the first-order stationary wave generated in the short side direction of the optical low-pass filter 410, the amplitude of the combined wave is small, so that it becomes difficult to discriminate the vibration and noise.

To solve the above-described problems, the piezoelectric elements 430a and 430b are stuck to the optical low-pass filter 410 so that the sensor electrode SF is located between the nodes of the first-order stationary wave generated in the short side direction of the optical low-pass filter 410. More specifically, the sensor electrode SF is located between a plurality of nodes of the vibration generated in the short side direction of the optical low-pass filter 410 to which the piezoelectric elements 430a and 430b are stuck.

According to the present embodiment, the sensor electrode SF is positioned on the central axis in the short side direction of the optical low-pass filter 410. The sensor electrode SF can thus detect the combined wave whose amplitude becomes the largest, so that the vibration and the noise can be easily discriminated. Further, the effect of the reflection wave generated in the long side edges of the optical low-pass filter 410 gradually decreases towards the central axis in the short side direction of the optical low-pass filter 410.

As a result, the sensor electrode SF can accurately detect the combined wave that conveys the foreign substance by being positioned on the central axis in the short side direction of the optical low-pass filter 410.

The sensor electrode SF may be of any size as long as the output voltage of the sensor electrode SF is sufficiently larger than a noise level. Since the driving electrode AF is an electrode for exciting the vibration in the optical low-pass filter 410, it is desirable to form the driving electrode AF as large as possible.

Figure 9:
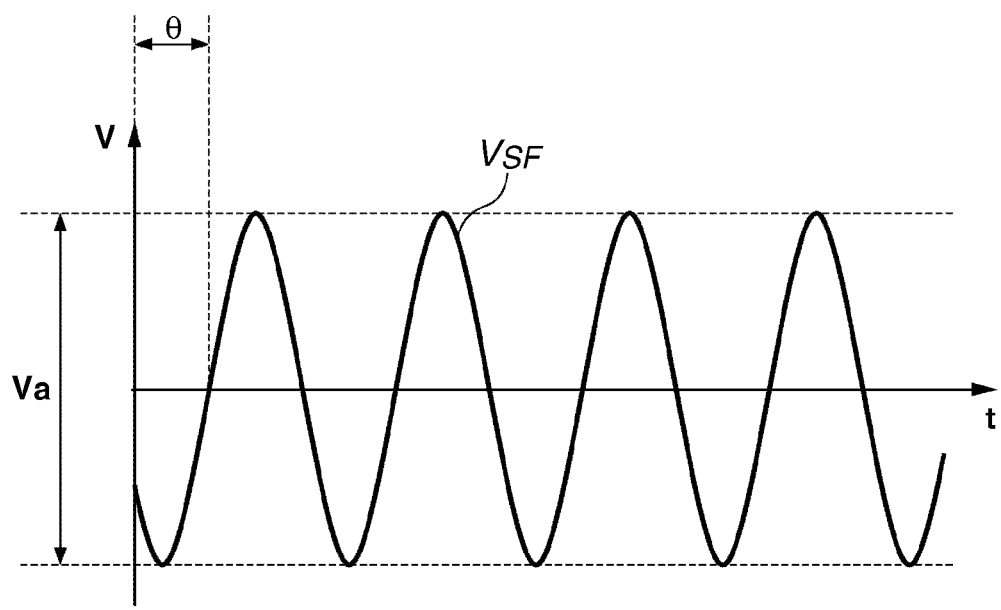
FIG. 9 illustrates a detected waveform detected by a vibration detection circuit 112 when the optical low-pass filter 410 is vibrated at frequency f.

The vibration detection in the optical low-pass filter 410 will be described below with reference to FIG. 9. FIG. 9 illustrates a waveform detected by the vibration detection circuit 112 when the optical low-pass filter 410 is vibrated at frequency f. The vibration detection circuit 112 detects a potential difference generated by expansion and contraction of the piezoelectric element 431.

A sinusoidal voltage is generated in the sensor electrode SF by a piezoelectric effect, along with the vibration of the optical low-pass filter 410. In such a case, the ground electrode SB is constantly maintained at a ground voltage (0 V), so that the vibration detection circuit 112 acquires a sinusoidal waveform VSF illustrated in FIG. 9.

A detected potential difference Va is proportional to the vibration amplitude of the optical low-pass filter 410. A phase θ detected at this time indicates a vibration phase of the optical low-pass filter 410. The combined wave generated in the optical low-pass filter 410 can thus be detected by monitoring the output voltage waveform.

A desired conveying vibration can then be generated by performing feedback control on the applied voltage and on an applied voltage frequency of the piezoelectric elements 430a and 430b to cause the potential difference Va and the phase θ to become predetermined values.

Further, the vibration detection circuit 112 can also detect failures and abnormalities. For example, if the potential difference Va detected by the vibration detection circuit 112 greatly differs from an expected size, the vibration of the optical low-pass filter 410 is assumed to be abnormal. As a result, the operation of the foreign substance removal unit can be stopped, or the foreign substance removal unit can be replaced.

Modification examples of the position of the sensor electrodes SF formed on each of the piezoelectric element 430a and 430b will be described below with reference to FIGS. 10A, 10B, 10C, 10D, and 10E.

In the modification examples illustrated in FIGS. 10A and 10B, the sizes of the two driving electrodes AF sandwiching the sensor electrode SF are different from that according to the first embodiment. Further, the sensor electrode SF is disposed between the central axis of the optical low-pass filter 410 and the node of the first-order stationary wave generated in the short side direction of the optical low-pass filter 410.

FIG. 10A illustrates the B sides of piezoelectric elements 1430a and 1430b stuck to the image sensor side surface of the optical low-pass filter 410, as viewed from the image sensor side. Referring to FIG. 10A, the sensor electrode SF formed on the piezoelectric element 1430a and the sensor electrode SF formed on the piezoelectric element 1430b are positioned to be line-symmetrical with respect to a center line in the long side direction of the optical low-pass filter 410.

FIG. 10B illustrates the B sides of piezoelectric elements 2430a and 2430b stuck to the image sensor side surface of the optical low-pass filter 410, as viewed from the image sensor side. Referring to FIG. 10B, the sensor electrode SF formed on the piezoelectric element 2430a and the sensor electrode SF formed on the piezoelectric element 2430b are positioned to be point-symmetrical with respect to a center point in the optical low-pass filter 410.

Since the generated combined wave is symmetrical, the output voltage levels of the two sensor electrodes SF can thus be set to approximately same levels by positioning the two sensor electrodes SF to be line-symmetrical or point-symmetrical.

The lengths of the long sides of the piezoelectric elements 1430a, 1430b, 2430a, and 2430b are each approximately equal to the length of the short side of the optical low-pass filter 410.

In contrast, the length of the long side of each piezoelectric element in the modification examples illustrated in FIGS. 10C, 10D, and 10E is shorter than the length of the short side of the optical low-pass filter 410.

FIG. 10C illustrates the B sides of piezoelectric elements 3430a and 3430b stuck to the image sensor side surface of the optical low-pass filter 410, as viewed from the image sensor side. Referring to FIG. 10C, the piezoelectric element 3430a is stuck to a lower region in the optical low-pass filter 410 with respect to the central axis in the short side direction of the optical low-pass filter 410, along one of the short sides (i.e., one side) of the optical low-pass filter 410.

Further, referring to FIG. 10C, the piezoelectric element 3430b is stuck to an upper region in the optical low-pass filter 410 with respect to the central axis in the short side direction of the optical low-pass filter 410, along the other short side (i.e., other side) of the optical low-pass filter 410.

As illustrated in FIG. 10C, each of the sensor electrodes SF is disposed on the central axis of the optical low-pass filter 410. Further, the driving electrode AF formed on the piezoelectric element 3430a and the driving electrode AF SF formed on the piezoelectric element 3430b are positioned to be point-symmetrical with respect to the center point in the optical low-pass filter 410.

FIG. 10D illustrates the B sides of piezoelectric elements 4430a and 4430b stuck to the image sensor side surface of the optical low-pass filter 410, as viewed from the image sensor side. Referring to FIG. 10D, the piezoelectric element 4430a is stuck to the upper region in the optical low-pass filter 410 with respect to the central axis in the short side direction of the optical low-pass filter 410, along one of the short sides (i.e., one side) of the optical low-pass filter 410.

Further, referring to FIG. 10D, the piezoelectric element 4430b is stuck to the upper region in the optical low-pass filter 410 with respect to the central axis in the short side direction of the optical low-pass filter 410, along the other short side (i.e., other side) of the optical low-pass filter 410.

As illustrated in FIG. 10D, each of the sensor electrodes SF is disposed between the central axis of the optical low-pass filter 410 and the node of the first-order stationary wave generated in the short side direction of the optical low-pass filter 410. The two sensor electrodes SF are positioned to be line-symmetrical with respect to the center line in the long side direction of the optical low-pass filter 410.

FIG. 10E illustrates the B sides of piezoelectric elements 5430a and 5430b stuck to the image sensor side surface of the optical low-pass filter 410, as viewed from the image sensor side. Referring to FIG. 10E, the piezoelectric element 5430a is stuck to the lower region in the optical low-pass filter 410 with respect to the central axis in the short side direction of the optical low-pass filter 410, along one of the short sides (i.e., one side) of the optical low-pass filter 410.

Further, referring to FIG. 10E, the piezoelectric element 5430b is stuck to the upper region in the optical low-pass filter 410 with respect to the central axis in the short side direction of the optical low-pass filter 410, along the other short side (i.e., other side) of the optical low-pass filter 410.

As illustrated in FIG. 10E, each of the sensor electrodes SF is disposed between the central axis of the optical low-pass filter 410 and the node of the first-order stationary wave generated in the short side direction of the optical low-pass filter 410. The two sensor electrodes SF are positioned to be point-symmetrical with respect to the center point in the optical low-pass filter 410.

Figure 11A:
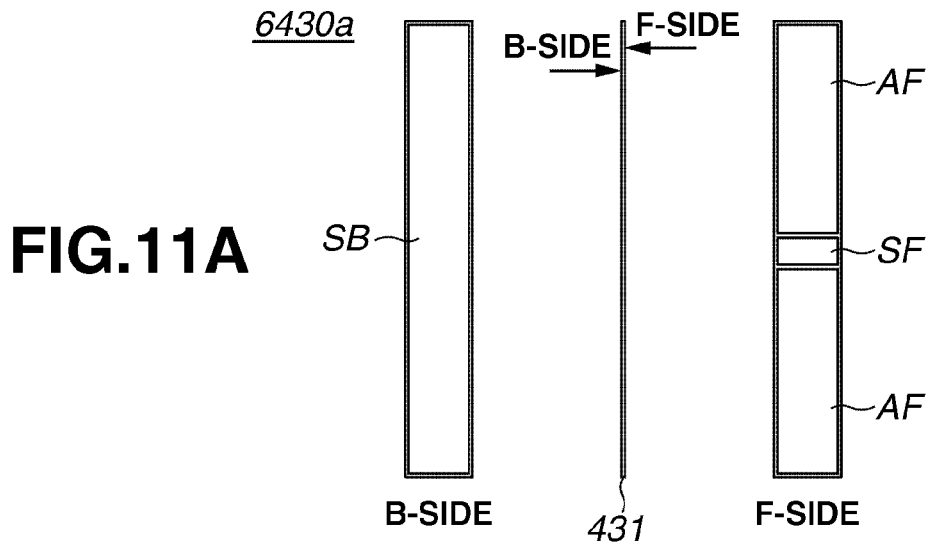
FIGS. 11A, 11B, and 11C illustrate modification examples of the piezoelectric elements according to the first embodiment.

FIG. 11A illustrates a modification example of the piezoelectric element, i.e., a three-sided view of a piezoelectric element 6430a. Referring to FIG. 11A, the piezoelectric element 6430a includes the piezoelectric member 431, i.e., a single-plate piezoelectric element, and three types of electrodes formed on the surface of the piezoelectric member 431. More specifically, the driving electrode AF, the sensor electrode SF, and the ground electrode SB are formed on the surface of the piezoelectric member 431.

As illustrated in FIG. 11A, two driving electrodes AF and one sensor electrode SF are formed on the F side (i.e., the first surface) of the piezoelectric member 431. One ground electrode SB to be electrically connected to the ground potential portion (i.e., ground) of the digital camera 100 is formed on the B side (i.e., the second surface) of the piezoelectric member 431.

The optical low-pass filter 410 is vibrated by the piezoelectric element driving circuit 111, i.e., the control circuit, applying the alternating voltage to the driving electrode AF.

The sensor electrode SF is the vibration detection electrode which detects the vibration of the optical low-pass filter 410. The sensor electrode SF is formed between the two driving electrodes AF on the F side of the piezoelectric member 431. The ground electrode SB is formed on the back side of the sensor electrode SF, so that the sensor electrode SF and the ground electrode SB are formed on the opposite sides to each other, sandwiching the piezoelectric member 431 in between.

The sensor electrode SF monitors how the output voltage generated by the sensor electrode SF changes with respect to the ground electrode SB corresponding to the ground voltage, and detects the vibration of the optical low-pass filter 410.

The driving electrodes AF, the sensor electrode SF, and the ground electrode SB are connected to the piezoelectric element flexible printed-circuit board (not illustrated). The driving electrodes AF are connected to the piezoelectric element driving circuit 111 via the wiring pattern on the piezoelectric element flexible printed-circuit board.

The sensor electrode SF is connected to the vibration detection circuit 112 via the wiring pattern on the piezoelectric element flexible printed-circuit board. The ground electrode SB is connected to the ground potential portion in the digital camera 100 via the wiring pattern on the piezoelectric element flexible printed-circuit board.

The F side or the B side of piezoelectric member 431 in the piezoelectric element 6430a configured as described above is stuck to the optical low-pass filter 410 so that the long side of the piezoelectric element 6430a is parallel to one of the short sides (i.e. one side) of the optical low-pass filter 410.

The piezoelectric element 6430b is configured similarly as the piezoelectric element 6430a. The F side or the B side of piezoelectric member 431 in the piezoelectric element 6430b is stuck to the optical low-pass filter 410 so that the long side of the piezoelectric element 6430b is parallel to the other short side (i.e., the other side) of the optical low-pass filter 410.

Figure 11B:
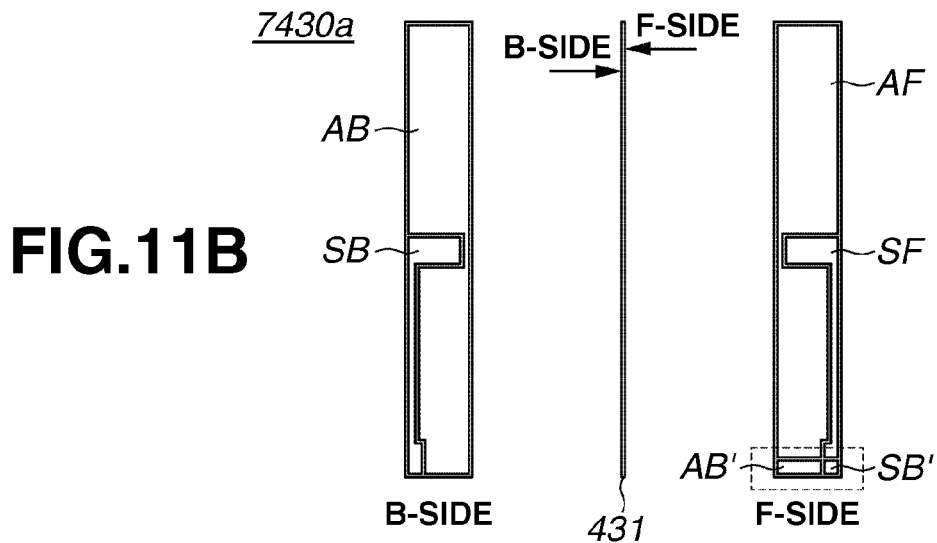

FIG. 11B illustrates a modification example of the piezoelectric element, i.e., a three-sided view of a piezoelectric element 7430a. Referring to FIG. 11B, the piezoelectric element 7430a includes the piezoelectric member 431, i.e., a single-plate piezoelectric element. Further, the piezoelectric element 7430a includes the driving electrode AF, the driving electrode AB, the sensor electrode SF, the ground electrode SB, a driving electrode AB', and a ground electrode SB' formed on the surface of the piezoelectric member 431.

The driving electrode AF, the driving electrode AB, the sensor electrode SF, and the ground electrode SB illustrated in FIG. 11B each function similarly as the driving electrode AF, the driving electrode AB, the sensor electrode SF, and the ground electrode SB illustrated in FIG. 7.

However, the driving electrode AF illustrated in FIG. 11B is different from the driving electrode AF illustrated in FIG. 7, in that the driving electrode AF on the F side of the piezoelectric member 431 is not divided into two by the sensor electrode SF. In other words, the driving electrode AF formed above the sensor electrode SF and the driving electrode AF formed below the sensor electrode SF are connected in the left side of the sensor electrode SF.

Similarly, the driving electrode AB formed above the ground electrode SB and the driving electrode AB formed below the ground electrode SB illustrated in FIG. 11B are connected in the right side of the ground electrode SB. The driving electrode AB positioned in the right side of the ground electrode SB and the driving electrode AF positioned in the left side of the sensor electrode SF in the piezoelectric element 7430*a* are positioned on opposite sides to each other, sandwiching the piezoelectric member 431 therebetween.

Further, in the piezoelectric element 7430*a*, leading lines are formed on the sensor electrode SF and the ground electrode SB in a downward direction of FIG. 11B. The sensor electrode SF and the ground electrode SB including the leading lines are formed on opposite sides to each other, sandwiching the piezoelectric member 431 therebetween.

Further, the driving electrode AB' formed on the F side of the piezoelectric member 431 is electrically connected to the driving electrode AB via a through-hole. Furthermore, the ground electrode SB' formed on the F side of the piezoelectric member 431 is electrically connected to the ground electrode SB via a through-hole.

According to the present modification example, the driving electrode AF, the driving electrode AB, the sensor electrode SF, and the ground electrode SB can be formed in the region surrounded by a dotted-line square frame illustrated in FIG. 11B. As a result, when the piezoelectric element 7430*a* is connected to the piezoelectric element flexible printed-circuit board (not illustrated), the flexible printed-circuit board can be connected to all of the electrodes in the dotted-line square frame.

Further, if the piezoelectric element 7430*a* is to be connected to the flexible printed-circuit board by thermal compression bonding using ACF, the distance between the thermally-bonded portion and the sensor electrode SF can be increased. It thus prevents characteristic degradation to occur in the sensor electrode SF even when excessive heat is applied to the thermally-bonded portion and the electrode is destroyed.

Furthermore, a connecting portion with the flexible printed-circuit board is not formed on the B side of the piezoelectric element 7430*a*. The B side of the piezoelectric element 7430*a* which is flat and even can thus be stuck to the image sensor side surface of the optical low-pass filter 410. As a result, adhesiveness of the piezoelectric element 7430*a* is improved, so that vibration efficiency of the optical low-pass filter 410 is also improved.

Figure 11C:
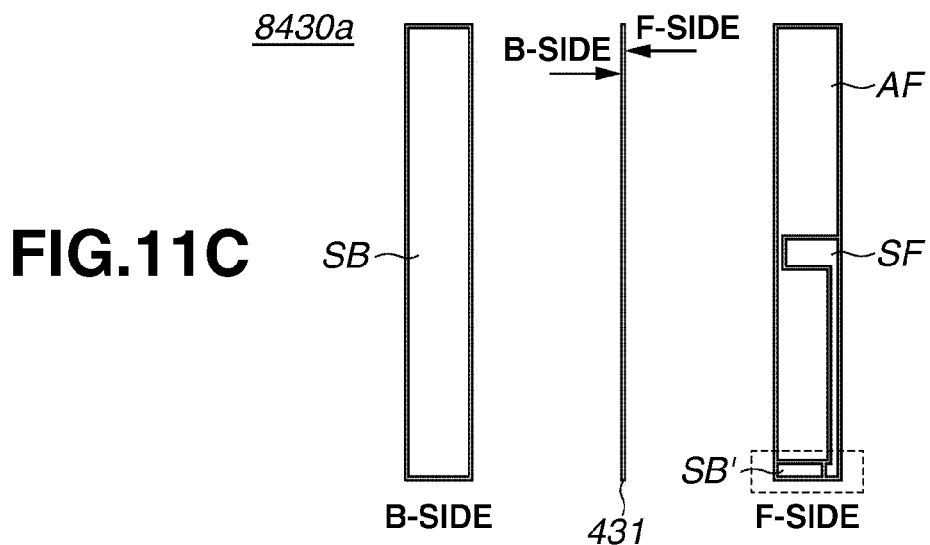

FIG. 11C illustrates a modification example of the piezoelectric element, i.e., a three-sided view of a piezoelectric element 8430*a*. Referring to FIG. 11C, the piezoelectric element 8430*a* includes the piezoelectric member 431, i.e., a single-plate piezoelectric element. Further, the piezoelectric element 8430*a* includes the driving electrode AF, the sensor electrode SF, the ground electrode SB, and the ground electrode SB' formed on the surface of the piezoelectric member 431.

The driving electrode AF, the sensor electrode SF, the ground electrode SB, and the ground electrode SB' illustrated in FIG. 11C each function similarly as the driving electrode AF, the sensor electrode SF, the ground electrode SB, and the ground electrode SB' illustrated in FIG. 11B.

In the piezoelectric element 8430*a*, only the ground electrode SB to be electrically connected to the ground potential portion (i.e., a ground) of the digital camera 100 is formed on the B side of the piezoelectric member 431. Further, the ground electrode SB' formed on the F side of the piezoelectric member 431 is electrically connected to the ground electrode SB via a through-hole.

According to the present modification example, the driving electrode AF, the sensor electrode SF, and the ground electrode SB can be formed in the region surrounded by the dotted-line square frame.

With such a configuration, a similar effect as that in the modification example illustrated in FIG. 11B can be obtained.

A second embodiment of the present invention will be described in detail below with reference to the drawings. According to the above-described first embodiment, the traveling wave which travels in the long side direction of the optical low-pass filter 410 is generated in the optical low-pass filter 410. In contrast, according to the second embodiment, a stationary wave is generated in the long side direction of the optical low-pass filter 410, i.e., in the direction perpendicular to the short sides of the optical low-pass filter 410 to which the piezoelectric elements 430*a* and 430*b* are stuck. The functional configuration of the digital camera 100 is similar to the block diagram illustrated in FIG. 1, and the configuration of the imaging unit 400 is similar to the exploded perspective view illustrated in FIG. 2.

According to the present embodiment, the stationary wave is generated in the long side direction of the optical low-pass filter 410. The foreign substance is then flicked out in the normal direction and removed.

Figure 12:
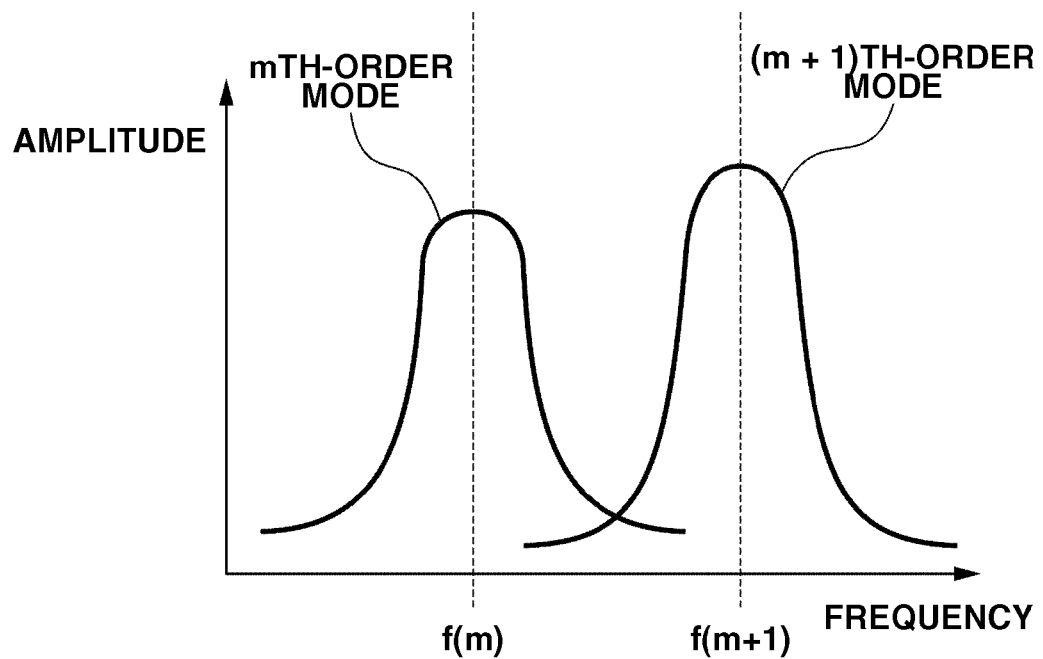
FIG. 12 is a graph illustrating a relationship between the frequency and the amplitude of two stationary waves excited in the optical low-pass filter 410 according to a second embodiment.

FIG. 12 is a graph illustrating the relationship between the frequency and the amplitude of the two stationary waves excited in the optical low-pass filter according to the present embodiment. Referring to FIG. 12, the bending vibration in the mth-order vibration mode is excited at a frequency indicated as f(m), and the bending vibration in the (m+1)th-order vibration mode is excited at a frequency indicated as f(m+1).

If the frequencies of the voltages to be applied to each of the piezoelectric elements 430*a* and 430*b* are then set to f(m) and f(m+1) respectively, both the resonance generated in the bending vibrations in the mth-order vibration mode and the (m+1)th-order vibration mode can be used.

FIGS. 13A and 13B illustrate waveforms generated in the mth-order vibration mode and the (m+1)th-order vibration mode when m is an odd number, and the voltages to be applied to the piezoelectric elements 430*a* and 430*b*. Referring to FIGS. 13A and 13B, a case where m=9 is illustrated as an example of m as an odd number. FIG. 13A illustrates the optical low-pass filter 410 as viewed from the side of the main mirror 6. The piezoelectric elements 430*a* and 430*b* are stuck to the surface of the optical low-pass filter 410 facing the image sensor 33.

Referring to FIG. 13A, a plurality of nodes in the long side direction of the piezoelectric element 430 appear at equal intervals in the direction of the long side of the optical low-pass filter 410 in the bending vibration of each vibration mode.

FIG. 13B illustrates the amplitude and the time phase of the alternating voltages applied to the piezoelectric elements 430a and 430b for exciting the bending vibration in each vibration mode, expressed in terms of real and imaginary components. Referring to FIG. 13B, row (1) indicates the alternating voltage applied for exciting the bending vibration in the mth-order vibration mode, and row (2) indicates the alternating voltage applied for exciting the bending vibration in the (m+1)th-order vibration mode.

The voltage applied for exciting the bending vibration in each vibration mode is normalized by the amplitude of the bending vibration in the mth-order vibration mode when an amplitude ratio of the bending vibrations in the mth-order vibration mode and the (m+1)th-order vibration mode is A:1. As a result, the same amplitude is acquired for the two vibration modes.

Two stationary waves of different orders are then generated in the long side direction of the optical low-pass filter 410 by alternately applying the application voltages indicated in row (1) and row (2) illustrated in FIG. 13B. More specifically, a first stationary wave is generated by exciting in the optical low-pass filter 410 the bending vibration in the mth-order vibration mode at the frequency f(m).

A second stationary wave is then generated by exciting the bending vibration in the (m+1)th-order vibration mode at the frequency f(m+1). By alternately performing the above-described processes, the foreign substance adhered to the surface of the optical low-pass filter 410 can be flicked out and removed.

Two stationary waves which are different by one order are thus generated in the optical low-pass filter 410. As a result, if the foreign substance is adhered to the node of the first stationary wave, the foreign substance can be removed by vibrating the optical low-pass filter 410 using the second stationary wave. In other words, if adjacent order vibration modes having an odd number of nodes and an even number of nodes respectively are used, the nodes appear at different positions, so that the foreign substance can be more efficiently removed.

Further, the number of stationary waves to be used is not limited to two. For example, three stationary waves of adjacent orders, such as of frequencies f(m), f(m+1), and f(m+2) may be alternately generated, or other numbers of stationary waves may be alternately generated.

Figure 14:
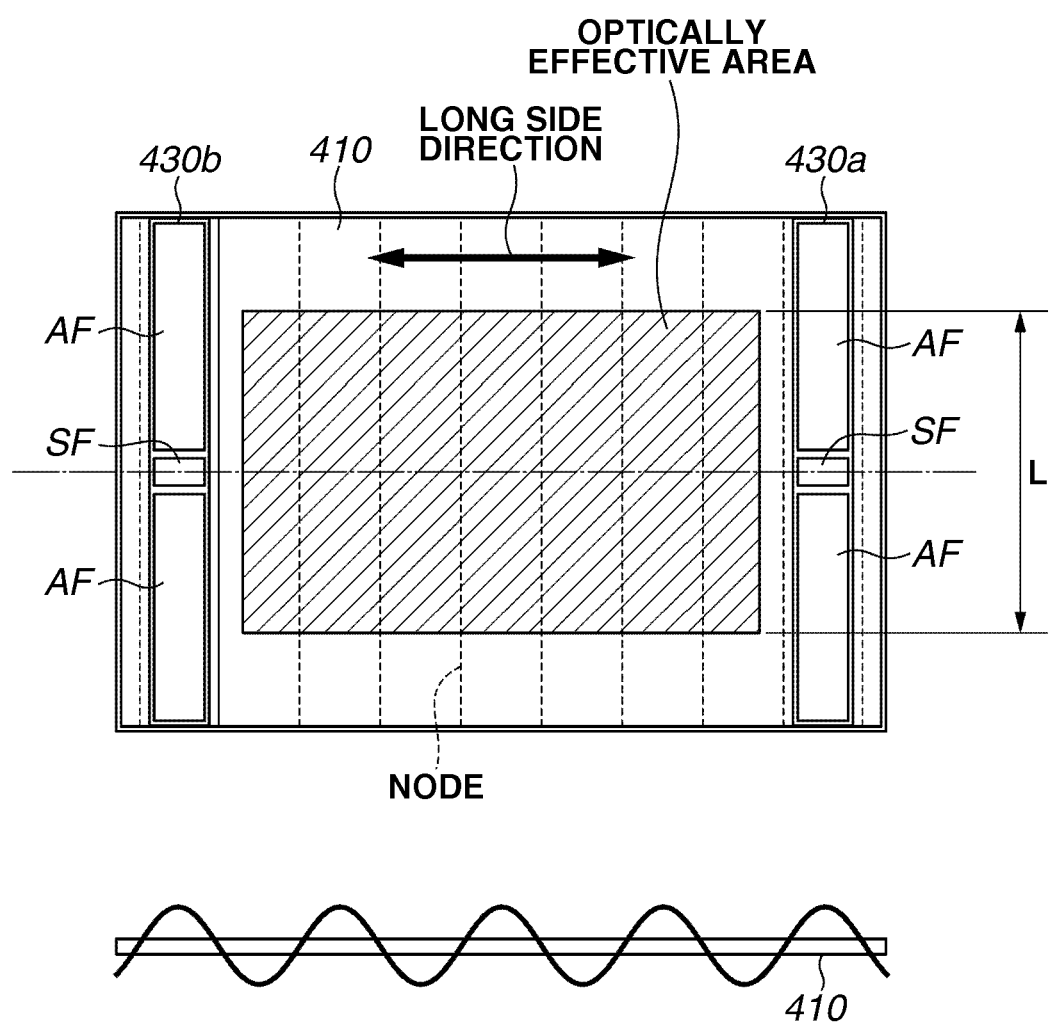
FIG. 14 illustrates a state in which the B sides of the piezoelectric elements 430a and 430b are stuck to the image sensor side surface of the optical low-pass filter 410, as viewed from the image sensor side, according to the second embodiment.

FIG. 14 illustrates the state in which the B sides of the piezoelectric elements 430a and 430b are stuck to the image sensor side surface of the optical low-pass filter 410, as viewed from the image sensor side.

Referring to FIG. 14, the piezoelectric element 430a is stuck to the optical low-pass filter 410 so that the long side thereof is disposed along one of the short sides (i.e., one side) of the optical low-pass filter 410. The length of the long side of the piezoelectric element 430a is approximately equal to the length of the short side of the optical low-pass filter 410.

Further, as illustrated in FIG. 14, the piezoelectric element 430b is stuck to the optical low-pass filter 410 so that the long side thereof is disposed along the other short side (i.e., the other side) of the optical low-pass filter 410. The length of the long side of the piezoelectric element 430b is approximately equal to the length of the short side of the optical low-pass filter 410.

Furthermore, FIG. 14 illustrates a schematic diagram of the bending vibration in the vibration mode at frequency f(m). FIG. 14 illustrates only the optical low-pass filter 410, and the piezoelectric elements 430a and 430b, as viewed from the image sensor side. The shaded area indicates the optical effective area through which the incident imaging light flux of the digital camera 100 passes. Further, FIG. 14 illustrates a case where m=9 as an example of m being an odd number.

As illustrated in FIG. 14, the stationary wave is excited in the long side direction of the optical low-pass filter 410, i.e., the direction perpendicular to the short side of the optical low pass filter 410 to which the piezoelectric elements 430 and 430b are stuck to. The dotted lines illustrated in FIG. 14 indicate the nodes of the excited stationary wave.

The first-order stationary wave is generated in the short side direction of the optical low-pass filter 410, similarly as in the first embodiment. However, if a stationary wave is to be generated in the long side direction, the amplitude of the first-order stationary wave generated in the short side direction becomes much smaller than the amplitude of the stationary wave generated in the long side direction. When the stationary wave is to be generated in the long side direction, the amplitude thereof is thus hardly changed by the amplitude of the first-order stationary wave generated in the short side direction.

The stationary wave generated in the long side direction of the optical low pass filter 410 is reflected at the long side edge of the optical low pass filter 410, i.e., the edges of the optical low pass filter 410 to which the piezoelectric elements 430a and 430b are not stuck.

The reflection wave generated at the long side edges of the optical low pass filter 410 interferes with the stationary wave generated in the long side direction of the optical low pass filter 410. Such interference generates unevenness in the size of the amplitude of the stationary wave in the vicinity of the long side edges of the optical low pass filter 410. Further, the interference generates a vibration whose phase is different from that of the stationary wave.

As a result, if the sensor electrode SF is positioned in the vicinity of the long side edge of the optical low pass filter 410, the sensor electrode SF cannot accurately detect the stationary wave generated in the long-side direction of the optical low pass filter 410.

To avoid such a problem, the piezoelectric elements 430a and 430b are stuck to the optical low pass filter 410 so that each of the sensor electrodes SF is positioned within the range of the optical effective area in the short side direction of the optical low pass filter 410. The range is indicated by an arrow L illustrated in FIG. 14.

According to the present embodiment, the sensor electrode SF is positioned on the central axis in the short side direction of the optical low pass filter 410. The effect of the reflection wave generated at the long side edges of the optical low pass filter 410 can thus be minimized.

The sensor electrode SF may be of any size as long as the output voltage of the sensor electrode SF is sufficiently larger than the noise level. Since the driving electrode AF is an electrode for exciting the vibration in the optical low-pass filter 410, it is desirable to form the driving electrode AF as large as possible.

As described above, the first and second embodiments are different only in the types of vibration generated in the long side direction of the optical low-pass filter 410. The various modification examples described according to the first embodiment may thus be similarly implemented in the second embodiment.

A third embodiment according to the present invention will be described in detail below with reference to the drawings. According to the above-described second embodiment, the voltage is applied to the two piezoelectric elements 430a and 430b, so that the stationary wave is generated in the long side direction of the optical low-pass filter 410. In contrast, according to the third embodiment, the stationary wave is generated in the long side direction of the optical low-pass filter 410 by applying the voltage to one piezoelectric element 430a. The third embodiment is thus different from the second embodiment in that the third embodiment does not include the piezoelectric element 430b which is stuck to the optical low-pass filter 410 according to the second embodiment.

FIG. 15 illustrates the state in which the B side of the piezoelectric elements 430a is stuck to the image sensor side surface of the optical low-pass filter 410, as viewed from the image sensor side. Referring to FIG. 15, the piezoelectric element 430a is stuck to the optical low-pass filter 410 so that the long side thereof is disposed along one of the short sides (i.e., one side) of the optical low-pass filter 410. The length of the long side of the piezoelectric element 430a is approximately equal to the length of the short side of the optical low-pass filter 410.

Further, FIG. 15 illustrates a schematic diagram of the bending vibration in the vibration mode at frequency f(m). FIG. 15 illustrates only the optical low-pass filter 410 and the piezoelectric element 430a, as viewed from the image sensor side. The shaded area indicates the optical effective area through which the incident imaging light flux of the digital camera passes. Further, FIG. 15 illustrates a case where m=9 as an example of m being an odd number.

As illustrated in FIG. 15, the stationary wave is excited in the long side direction of the optical low-pass filter 410, i.e., the direction perpendicular to the short side of the optical low pass filter 410 to which the piezoelectric element 430a is stuck to. The dotted line illustrated in FIG. 14 indicates the nodes of the stationary wave.

The stationary wave generated in the long side direction of the optical low pass filter 410 is reflected at the long side edges of the optical low pass filter 410, similarly as in the second embodiment. The reflection wave generated at the long side edges of the optical low pass filter 410 interferes with the stationary wave generated in the long side direction of the optical low pass filter 410.

According to the third embodiment, the piezoelectric element 430a is stuck to the optical low pass filter 410 so that the sensor electrode SF is positioned within the range of the optical effective area in the short side direction of the optical low pass filter 410.

According to the present embodiment, the sensor electrode SF is positioned on the central axis in the short side direction of the optical low pass filter 410. The effect of the reflection wave generated at the long side edges of the optical low pass filter 410 can thus be minimized.

The optical member according to the present invention is not limited to the optical low-pass filter 410. Further, according to the above-described embodiments, the vibration is excited in a quartz birefringent plate. However, the material of the birefringent plate is not limited to quartz, and may also be lithium niobate. Further, the vibration may be excited in the optical low-pass filter formed by bonding together the birefringent plate, the phase plate, and the infrared cut filter, or in a single infrared cut filter. Furthermore, the vibration may be generated in a single glass plate disposed in front of the birefringent plate.

According to the above-described embodiments, the present invention is applied to the digital camera. However, the present invention can be applied to optical apparatuses such as a liquid crystal projector. In such a case, if foreign substances such as dust are adhered to the surface of the optical member in a projection optical system, a shadow of the foreign substances also become projected. The configuration similar to the above-described embodiments can thus be applied.

While the present invention has been described with reference to embodiments, it is to be understood that the invention is defined by the following claims.

This application claims priority from Japanese Patent Application No. 2011-013255 filed Jan. 25, 2011, which is hereby incorporated by reference herein in its entirety.

What is claimed is:

1. A foreign substance removal unit comprising:
   an optical member, disposed in an optical path, which is rectangular-shaped and in which an optical effective area for a light flux to pass through is set;
   a piezoelectric element including a piezoelectric member on which a driving electrode and a sensor electrode are formed;
   a driving unit configured to drive the driving electrode, to which the driving electrode is connected; and
   a vibration detection unit configured to detect vibration of the optical member, to which the sensor electrode is connected,
   wherein the piezoelectric element is provided on a surface of the optical member outside the optical effective area and along one side of the optical member,
   wherein the sensor electrode is formed on the piezoelectric member so that the sensor electrode is positioned within a range of the optical effective area in a side direction of the optical member to which the piezoelectric element is provided.

2. The foreign substance removal unit according to claim 1, wherein the sensor electrode is formed on the piezoelectric member to be positioned on a central axis in a side direction of the optical member to which the piezoelectric element is provided.

3. The foreign substance removal unit according to claim 1, wherein the piezoelectric element excites at the same time a first bending vibration and a second bending vibration whose time phase is different from that of the first bending vibration, and whose order is different by one from the first bending vibration, to generate a traveling wave that travels in a direction perpendicular to a side of the optical member to which the piezoelectric element is provided.

4. The foreign substance removal unit according to claim 1, wherein the piezoelectric element excites a first bending vibration to generate a first stationary wave in a direction perpendicular to a side of the optical member to which the piezoelectric element is provided, and wherein the piezoelectric element excites a second bending vibration whose order is different by one from the first bending vibration, to generate a second stationary wave in a direction perpendicular to a side of the optical member to which the piezoelectric element is provided.

5. A foreign substance removal unit comprising:
   an optical member, disposed in an optical path, which is rectangular-shaped and in which an optical effective area for a light flux to pass through is set;
   a piezoelectric element including a piezoelectric member on which a driving electrode and a sensor electrode are formed;
   a driving unit configured to drive the driving electrode, to which the driving electrode is connected; and
   a vibration detection unit configured to detect vibration of the optical member, to which the sensor electrode is connected,
   wherein the piezoelectric element is provided on a surface of the optical member outside the optical effective area and along one side of the optical member,
   wherein the sensor electrode is formed on the piezoelectric member so that the sensor electrode is positioned between a plurality of nodes of a vibration generated in a side direction of the optical member to which the piezoelectric element is provided.

6. The foreign substance removal unit according to claim 5, wherein the sensor electrode is formed on the piezoelectric member to be positioned on a central axis in a side direction of the optical member to which the piezoelectric element is provided.

7. The foreign substance removal unit according to claim 5, wherein the piezoelectric element excites at the same time a first bending vibration and a second bending vibration whose time phase is different from that of the first bending vibration, and whose order is different by one from the first bending vibration, to generate a traveling wave that travels in a direction perpendicular to a side of the optical member to which the piezoelectric element is provided.

8. The foreign substance removal unit according to claim 5, wherein the piezoelectric element excites a first bending vibration to generate a first stationary wave in a direction perpendicular to a side of the optical member to which the piezoelectric element is provided, and wherein the piezoelectric element excites a second bending vibration whose order is different by one from the first bending vibration, to generate a second stationary wave in a direction perpendicular to a side of the optical member to which the piezoelectric element is provided.

9. The foreign substance removal unit according to claim 5, wherein a size of the optical member is set so that the plurality of nodes is generated outside the optical effective area.

10. An optical apparatus including a foreign substance removal unit, the apparatus comprising:
an optical member, disposed in an optical path, which is rectangular-shaped and in which an optical effective area for a light flux to pass through is set;
a piezoelectric element including a piezoelectric member on which a driving electrodes and a sensor electrode are formed;
a driving unit configured to drive the driving electrodes, to which the driving electrode is connected; and
a vibration detection unit configured to detect vibration of the optical member, to which the sensor electrode is connected,
wherein the piezoelectric element is provided on a surface of the optical member outside the optical effective area and along one side of the optical member,
wherein the sensor electrode is formed on the piezoelectric member so that the sensor electrode is positioned within a range of the optical effective area in a side direction of the optical member to which the piezoelectric element is provided.

11. The optical apparatus including the foreign substance removal unit according to claim 10, wherein the sensor electrode is formed on the piezoelectric member to be positioned on a central axis in a side direction of the optical member to which the piezoelectric element is provided.

12. The optical apparatus including the foreign substance removal unit according to claim 10, wherein the piezoelectric element excites at the same time a first bending vibration and a second bending vibration whose time phase is different from that of the first bending vibration, and whose order is different by one from the first bending vibration, to generate a traveling wave that travels in a direction perpendicular to aside of the optical member to which the piezoelectric element is provided.

13. The optical apparatus including the foreign substance removal unit according to claim 10, wherein the piezoelectric element excites a first bending vibration to generate a first stationary wave in a direction perpendicular to a side of the optical member to which the piezoelectric element is provided, and wherein the piezoelectric element excites a second bending vibration whose order is different by one from the first bending vibration, to generate a second stationary wave in a direction perpendicular to a side of the optical member to which the piezoelectric element is provided.

14. An optical apparatus including a foreign substance removal unit comprising:
an optical member, disposed in an optical path, which is rectangular-shaped and in which an optical effective area for a light flux to pass through is set;
a piezoelectric element including a piezoelectric member on which a driving electrode and a sensor electrode are formed;
a driving unit configured to drive the driving electrode, to which the driving electrodes is connected; and
a vibration detection unit configured to detect vibration of the optical member, to which the sensor electrode is connected,
wherein the piezoelectric element is provided on a surface of the optical member outside the optical effective area and along one side of the optical member,
wherein the sensor electrode is formed on the piezoelectric member so that the sensor electrode is positioned between a plurality of nodes of a vibration generated in a side direction of the optical member to which the piezoelectric element is provided.

15. The optical apparatus including the foreign substance removal unit according to claim 14, wherein the sensor electrode is formed on the piezoelectric member to be positioned on a central axis in a side direction of the optical member to which the piezoelectric element is provided.

16. The optical apparatus including the foreign substance removal unit according to claim 14, wherein the piezoelectric element excites at the same time a first bending vibration and a second bending vibration whose time phase is different from that of the first bending vibration, and whose order is different by one from the first bending vibration, to generate a traveling wave that travels in a direction perpendicular to a side of the optical member to which the piezoelectric element is provided.

17. The optical apparatus including the foreign substance removal unit according to claim 14, wherein the piezoelectric element excites a first bending vibration to generate a first stationary wave in a direction perpendicular to a side of the optical member to which the piezoelectric element is provided, and wherein the piezoelectric element excites a second bending vibration whose order is different by one from the first bending vibration, to generate a second stationary wave in a direction perpendicular to a side of the optical member to which the piezoelectric element is provided.

18. The optical apparatus including the foreign substance removal unit according to claim 14, wherein a size of the optical member is set so that the plurality of nodes is generated outside the optical effective area.

* * * * *